United States Patent
Kato

(10) Patent No.: US 8,610,001 B2
(45) Date of Patent: Dec. 17, 2013

(54) PRINTED WIRING BOARD AND METHOD FOR MANUFACTURING PRINTED WIRING BOARD

(75) Inventor: Hisashi Kato, Ogaki (JP)

(73) Assignee: Ibiden Co., Ltd., Ogaki-shi (JP)

( * ) Notice: Subject to any disclaimer, the term of this patent is extended or adjusted under 35 U.S.C. 154(b) by 208 days.

(21) Appl. No.: 13/106,991

(22) Filed: May 13, 2011

(65) Prior Publication Data

US 2011/0284277 A1    Nov. 24, 2011

Related U.S. Application Data

(60) Provisional application No. 61/347,140, filed on May 21, 2010.

(51) Int. Cl.
*H05K 1/11*    (2006.01)
(52) U.S. Cl.
USPC .............................. 174/264; 174/260; 174/262
(58) Field of Classification Search
None
See application file for complete search history.

(56) References Cited

U.S. PATENT DOCUMENTS

| | | | |
|---|---|---|---|
| 6,420,017 B1* | 7/2002 | Matsuda et al. | 428/209 |
| 7,243,425 B2* | 7/2007 | Hirata | 29/852 |
| 2004/0188123 A1* | 9/2004 | Peterson et al. | 174/52.2 |
| 2008/0053693 A1* | 3/2008 | Wu | 174/265 |

FOREIGN PATENT DOCUMENTS

JP    A-04-320093    11/1992

* cited by examiner

*Primary Examiner* — Ishwarbhai Patel
(74) *Attorney, Agent, or Firm* — Oblon, Spivak, McClelland, Maier & Neustadt, L.L.P.

(57) ABSTRACT

A printed wiring board including an insulation layer, a conductive circuit on the insulation layer, an outermost interlayer resin insulation layer formed on the insulation layer and the conductive circuit and having a via-conductor opening connected to the conductive circuit, a land structure including a first land formed on the outermost interlayer resin insulation layer around the via-conductor opening and a second land formed on the outermost interlayer resin insulation layer around the first land, and a via conductor formed in the via-conductor opening through the outermost interlayer resin insulation layer such that the first land of the land structure on the outermost interlayer resin insulation layer is connected to the conductive circuit on the insulation layer. The land structure has a space between the first land and second land of the land structure, and the first land of the land structure is directly connected to the via conductor.

20 Claims, 26 Drawing Sheets

FIG. 9
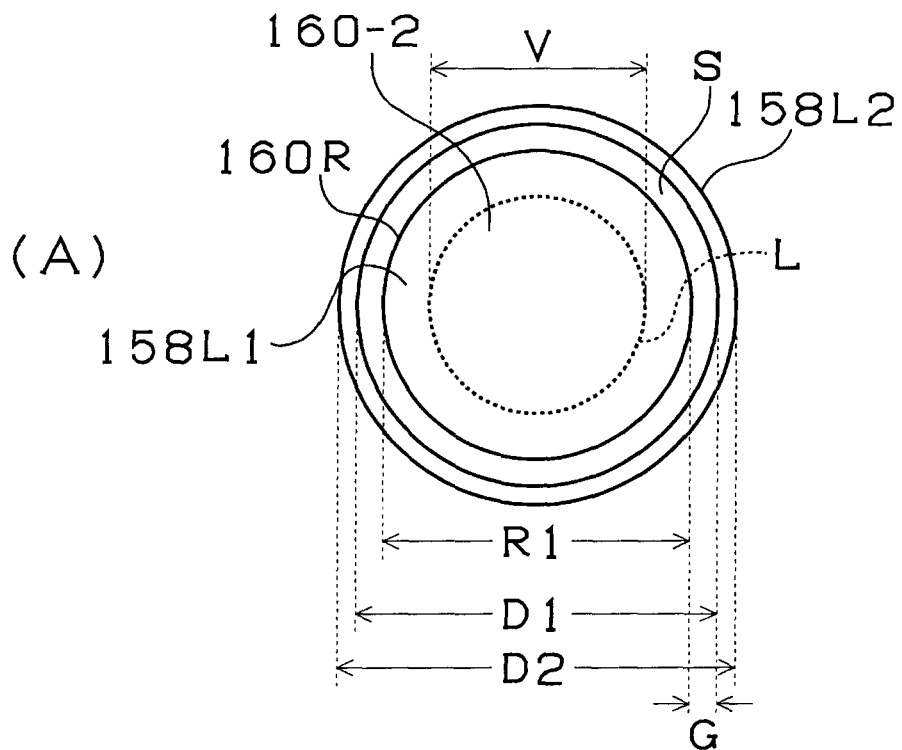
(A)
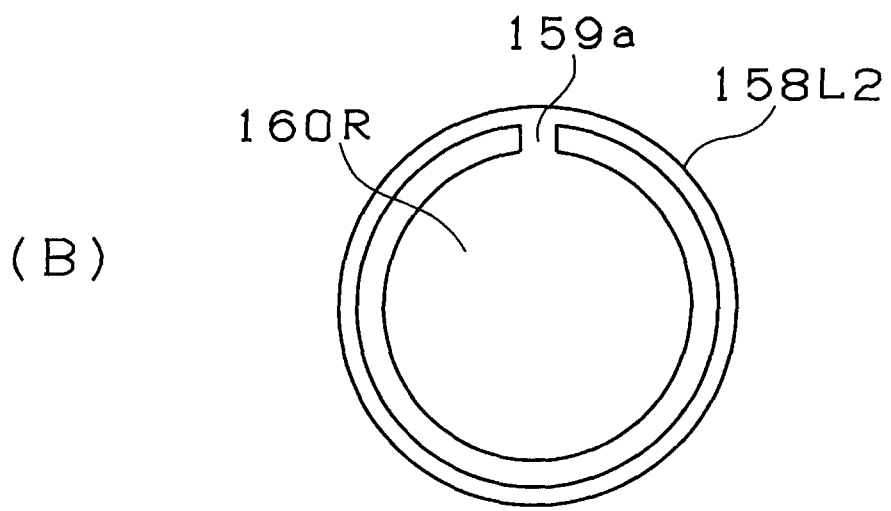
(B)

FIG. 10
(A)
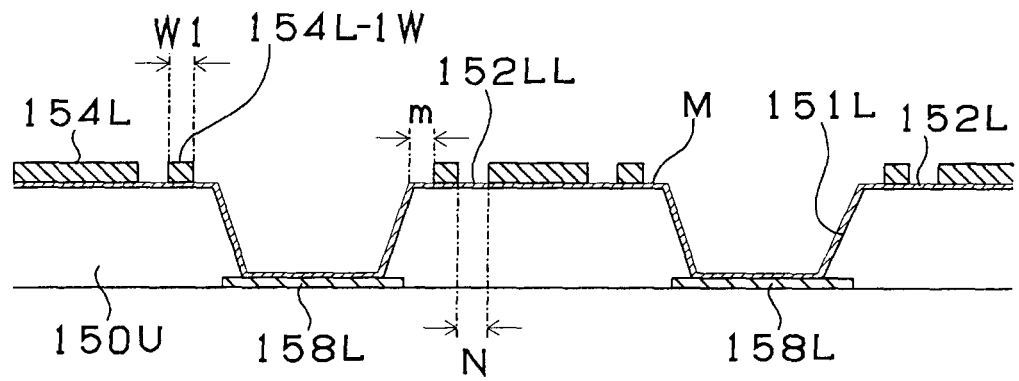
(B)
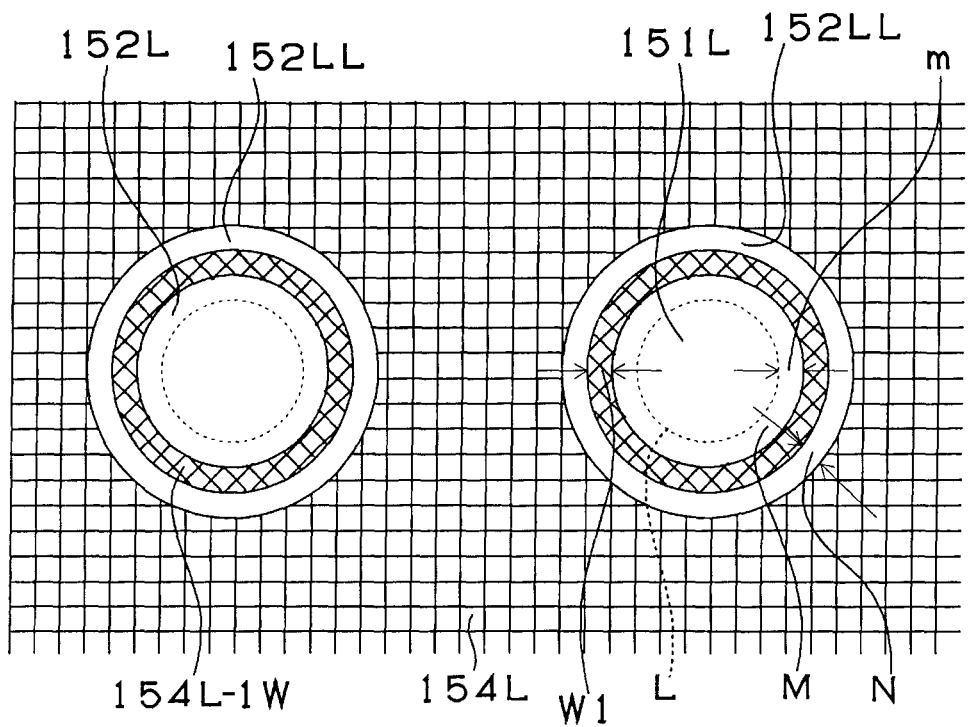

FIG. 11
(A)
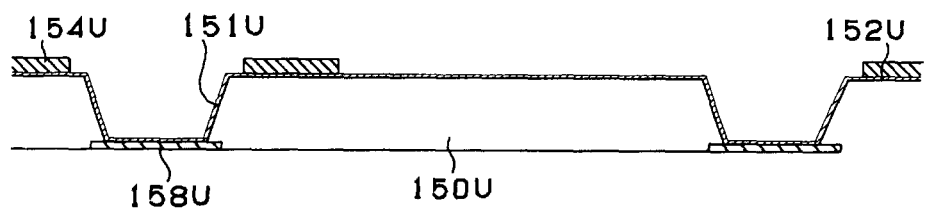
(B)
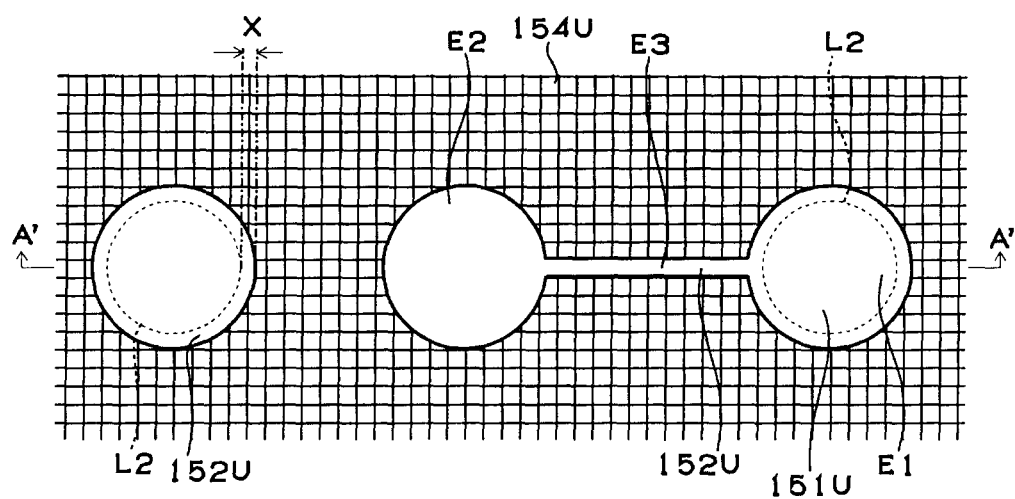

FIG. 12
(A)
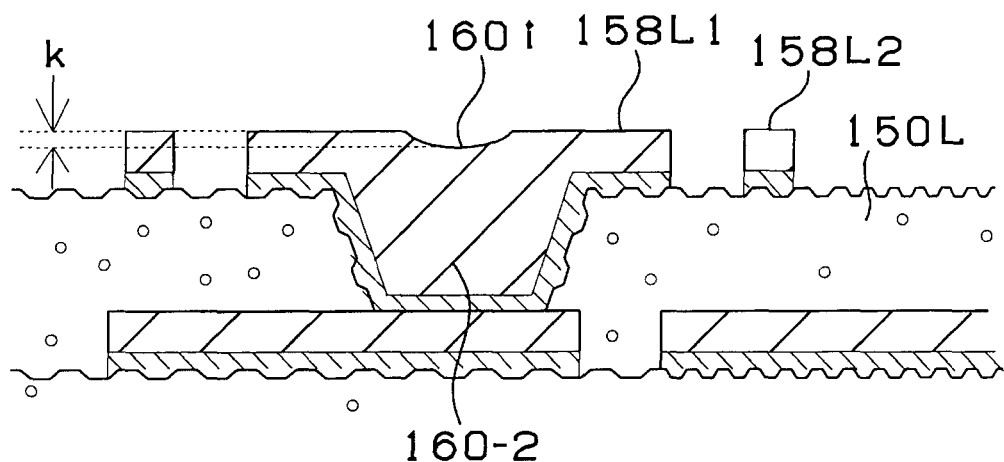
(B)
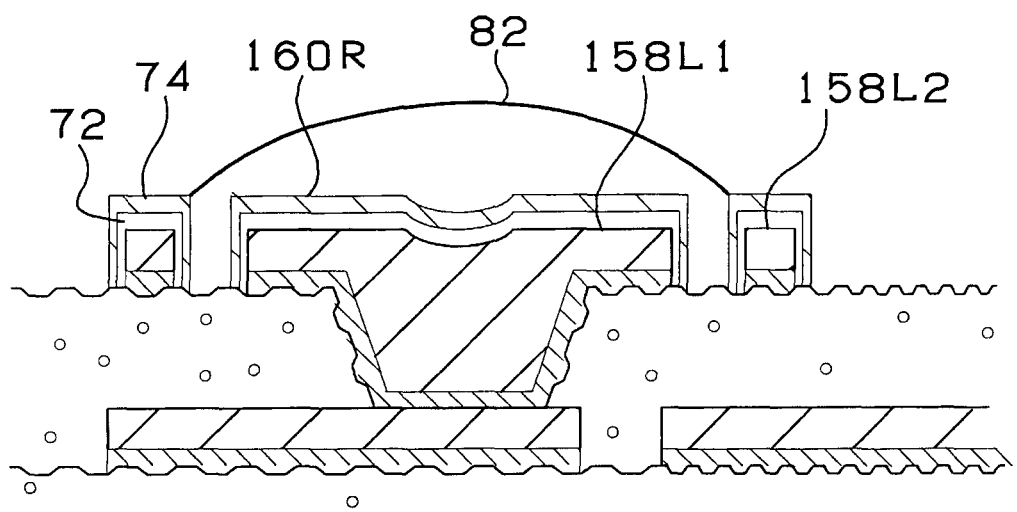

FIG. 13
(A)
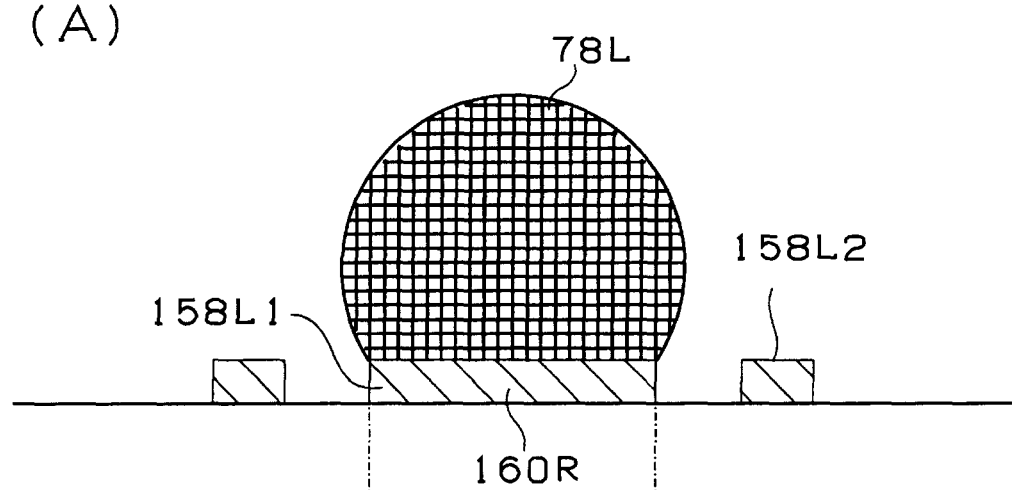
(B)
Bent Portion of
Solder Bump
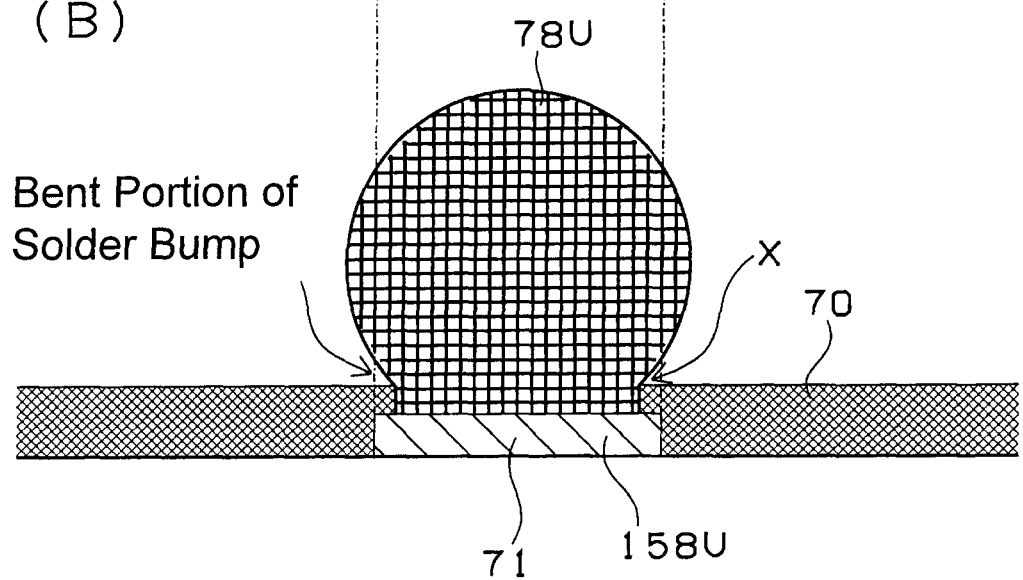

FIG. 15
(A)
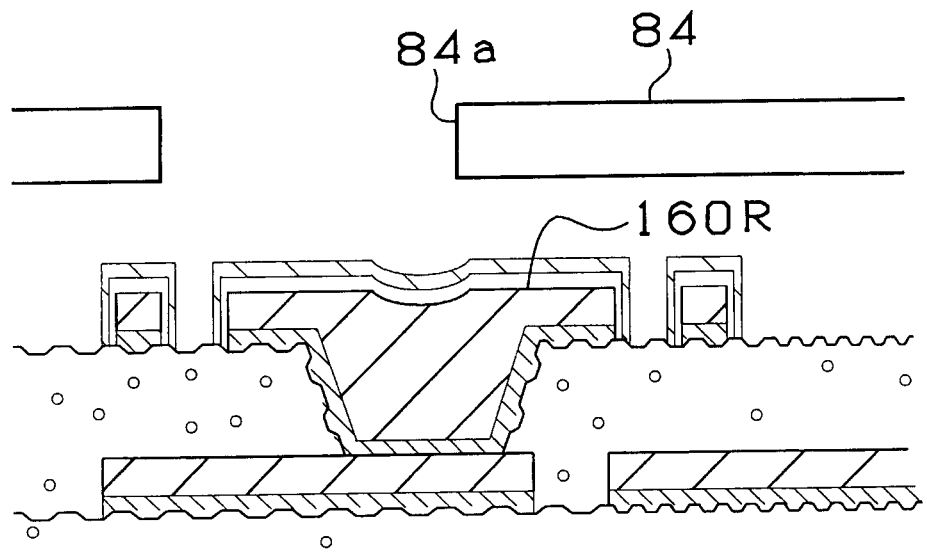
(B)
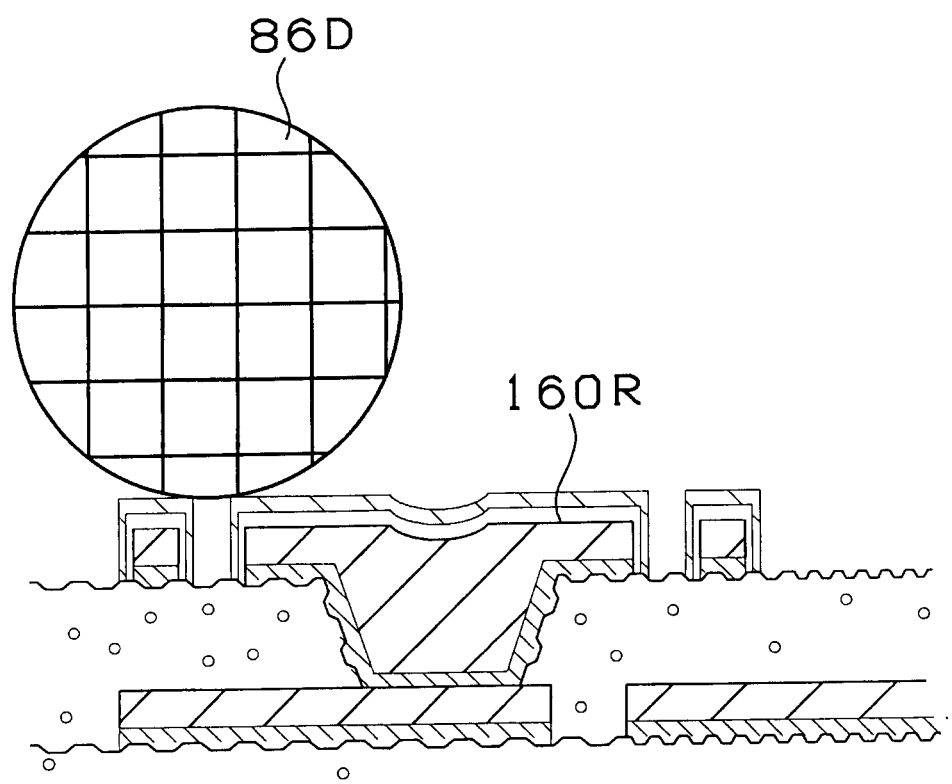

PRINTED WIRING BOARD AND METHOD FOR MANUFACTURING PRINTED WIRING BOARD

CROSS-REFERENCE TO RELATED APPLICATIONS

The present application claims the benefits of priority to U.S. Application No. 61/347,140, filed May 21, 2010. The contents of that application are incorporated herein by reference in their entirety.

BACKGROUND OF THE INVENTION

1. Field of the Invention

The present invention relates to a printed wiring board having solder pads for connection with an electronic component or an external substrate and to a method for manufacturing such a printed wiring board.

2. Discussion of the Background

Japanese Laid-Open Patent Publication H04-320093 describes a pad (fourth pad 14) made up of circular conductor (14-2), slit 8 surrounding conductor (14-2) and annular conductor (14-1) surrounding the slit (see FIG. 2). Conductor (14-1), which is part of the pad, is connected to first pad 11 by a surface pattern. Then, first pad 11 is connected to first inner-layer pattern 21 by surface pattern 17 and a via conductor. On the other hand, conductor (14-2), which is part of the pad, is connected to third inner-layer pattern 23 by a via conductor. Fourth pad 14 simplifies the modification process when switching input/output signals. For example, first pad 11 and the first inner-layer pattern are electrically continuous at first. At that time, conductor (14-1) and conductor (14-2) are not electrically continuous. When the circuit network is required to be modified, surface pattern 17 is cut off, and conductor (14-1) and conductor (14-2) are connected by stud bump 6. Accordingly, first pad 11 is connected to the third inner-layer pattern instead of the first inner-layer pattern, and switching input/output signals is completed. The contents of this publication are incorporated herein by reference in their entirety.

SUMMARY OF THE INVENTION

According to one aspect of the present invention, a printed wiring board includes an insulation layer, a conductive circuit on the insulation layer, an outermost interlayer resin insulation layer formed on the insulation layer and the conductive circuit and having a via-conductor opening connected to the conductive circuit, a land structure including a first land formed on the outermost interlayer resin insulation layer around the via-conductor opening and a second land formed on the outermost interlayer resin insulation layer around the first land, and a via conductor formed in the via-conductor opening through the outermost interlayer resin insulation layer such that the first land of the land structure on the outermost interlayer resin insulation layer is connected to the conductive circuit on the insulation layer. The land structure has a space between the first land and second land of the land structure, and the first land of the land structure is directly connected to the via conductor.

According to another aspect of the present invention, a printed wiring board includes an interlayer resin insulation layer, an electrode embedded in the interlayer resin insulation layer, a land structure including a first land formed on the interlayer resin insulation layer on the opposite side of the electrode and a second land formed on the interlayer resin insulation layer around the first land, and a via conductor penetrating through the interlayer resin insulation layer and connecting the first land of the land structure and the electrode. The land structure has a space between the first land and second land of the land structure, and the electrode has a surface left exposed by the interlayer resin insulation layer and recessed from a surface of the interlayer resin insulation layer.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 9(A) is a plan view showing a second solder pad and a second land in the first embodiment, and FIG. 9(B) is a view showing short-circuit wiring;

FIG. 10 is a view showing a plating resist for forming first and second lands;

FIG. 11 is a view showing a plating resist for forming via lands;

FIG. 12(A) is a magnified view showing a recess, and

FIG. 12(B) is a magnified view showing a second solder pad on which flux is applied;

FIG. 13 is a view showing a tall solder bump formed on a first solder pad and a second solder pad;

FIG. 15 is a view showing a method for forming a solder bump according to the second modified example of the first embodiment;

DETAILED DESCRIPTION OF THE EMBODIMENTS

Figure 1:
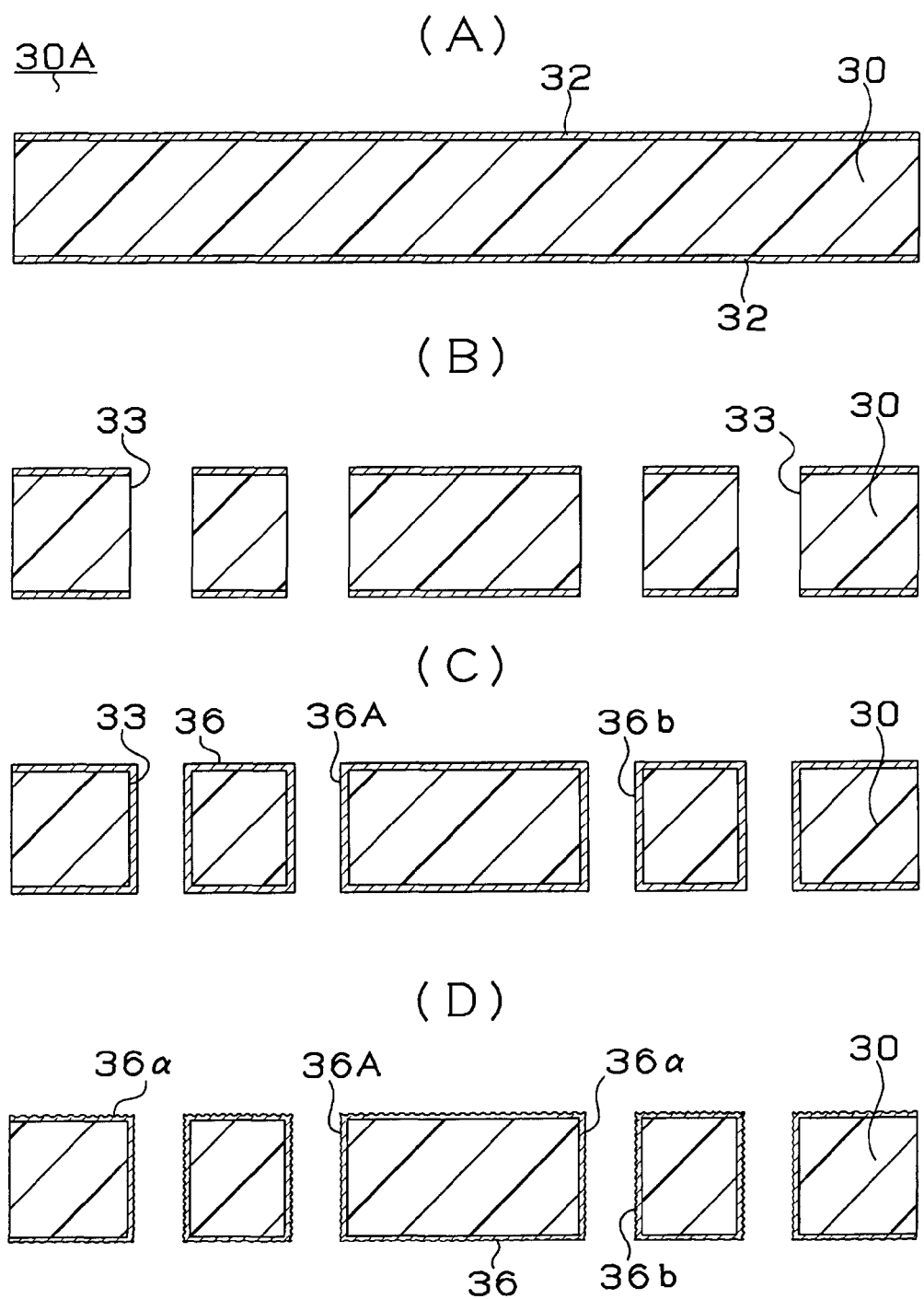
FIGS. 1(A)-(D) are views showing steps of a method for manufacturing a multilayer printed wiring board according to the first embodiment.
Figure 2:
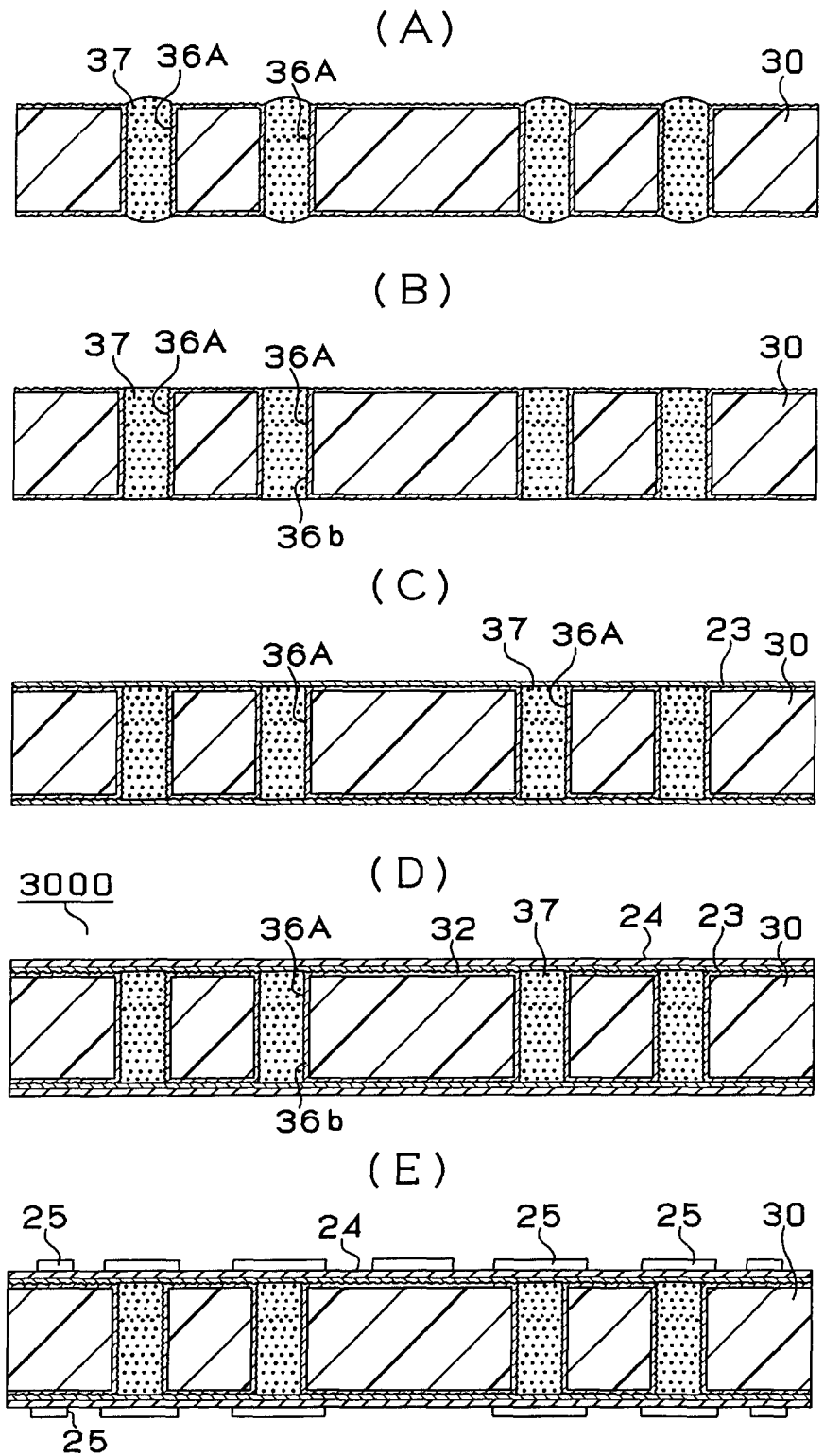
FIGS. 2(A)-(E) are views showing steps of a method for manufacturing a multilayer printed wiring board according to the first embodiment.
Figure 3:
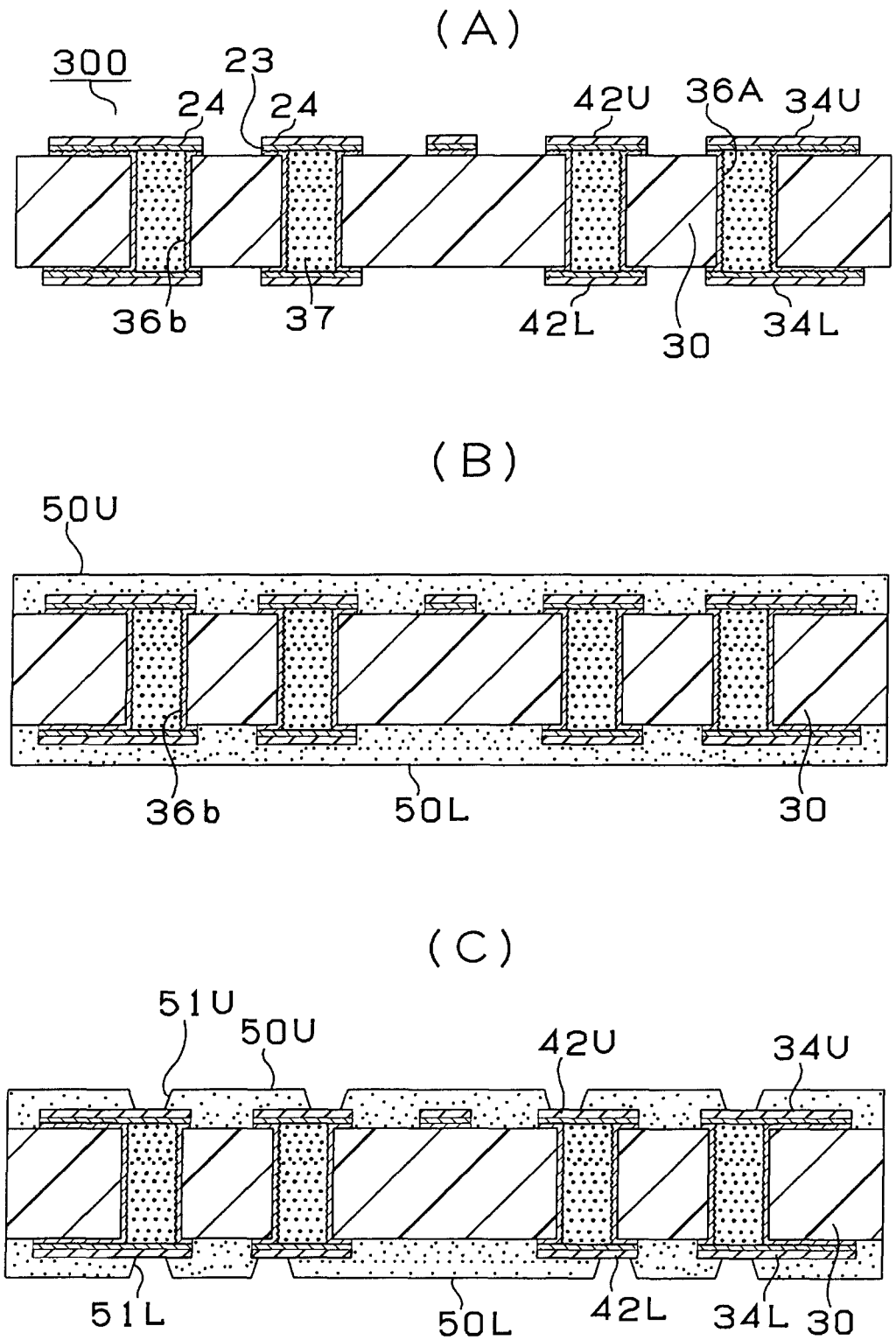
FIGS. 3(A)-(C) are views showing steps of a method for manufacturing a multilayer printed wiring board according to the first embodiment.
Figure 4:
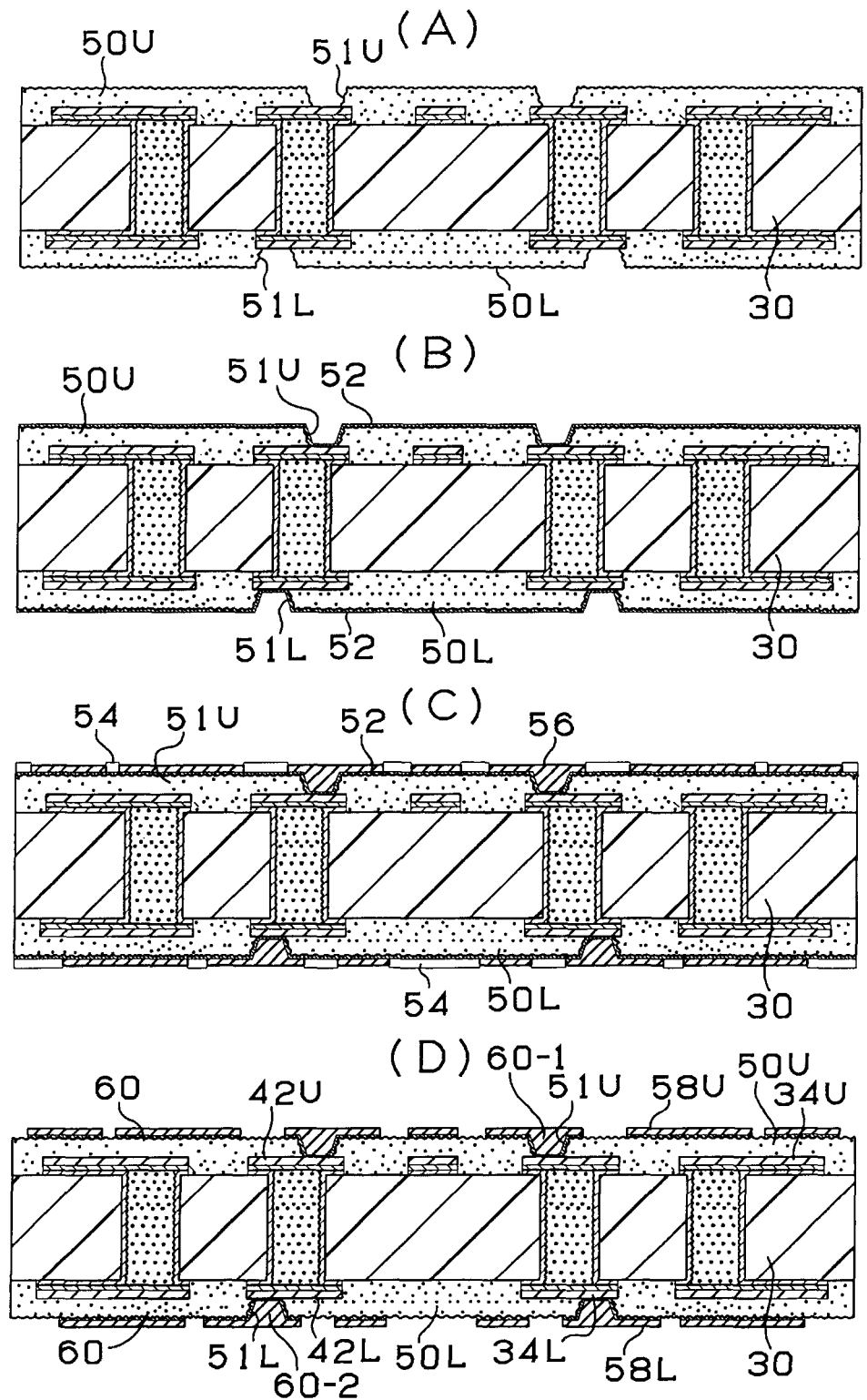
FIGS. 4(A)-(D) are views showing steps of a method for manufacturing a multilayer printed wiring board according to the first embodiment.
Figure 5:
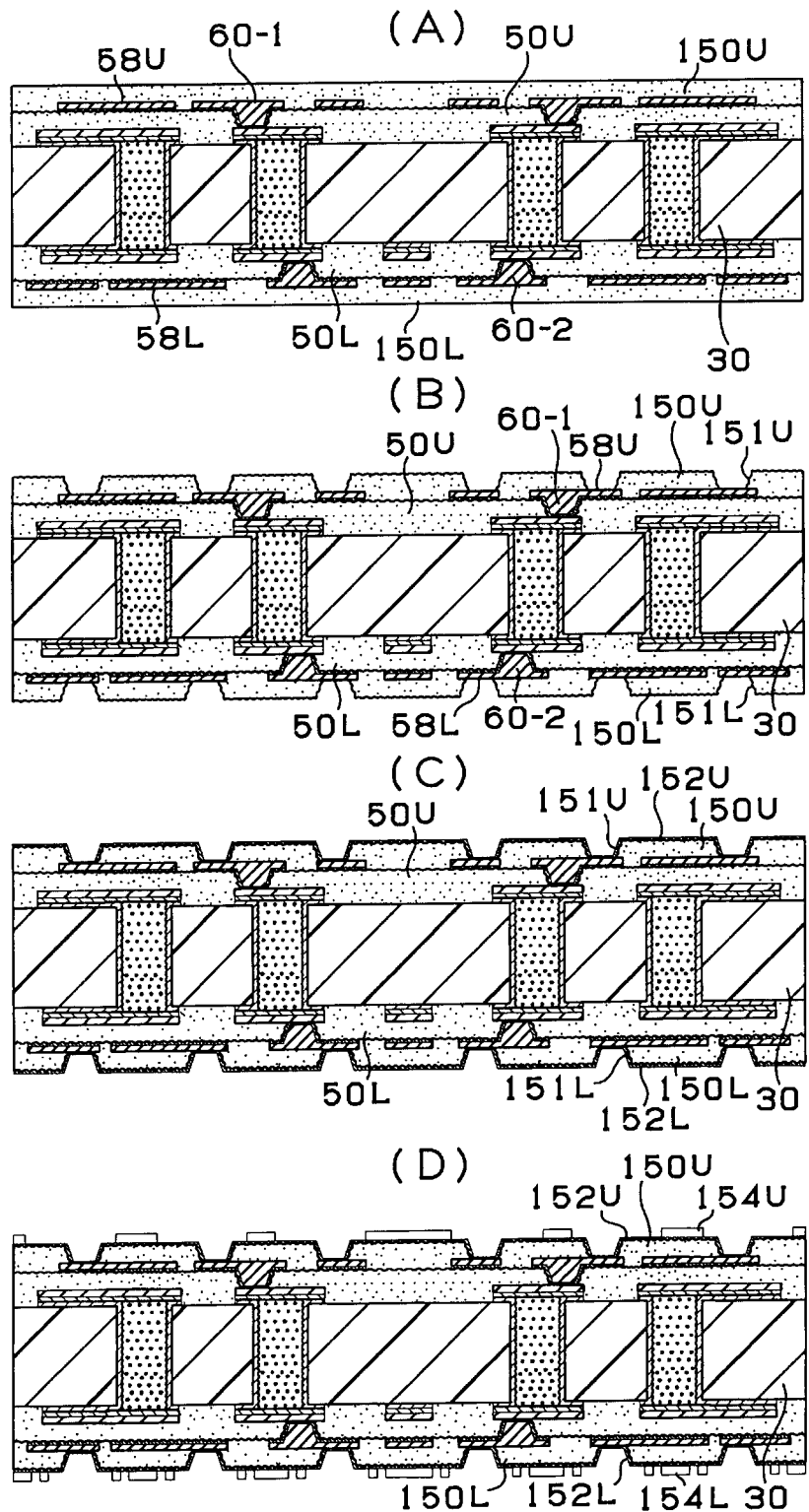
FIGS. 5(A)-(D) are views showing steps of a method for manufacturing a multilayer printed wiring board according to the first embodiment.
Figure 6:
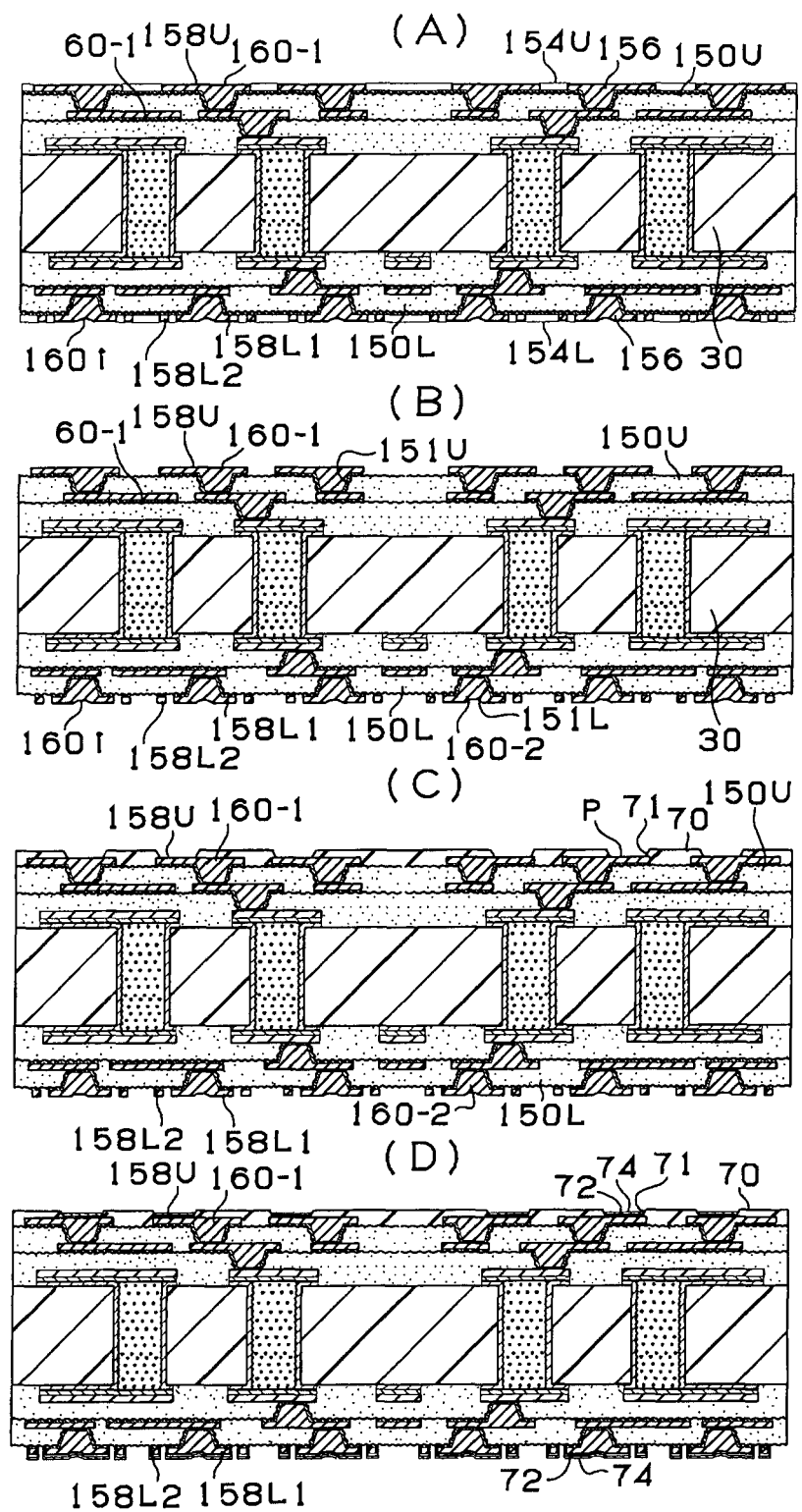
FIGS. 6(A)-(D) are views showing steps of a method for manufacturing a multilayer printed wiring board according to the first embodiment.
Figure 7:
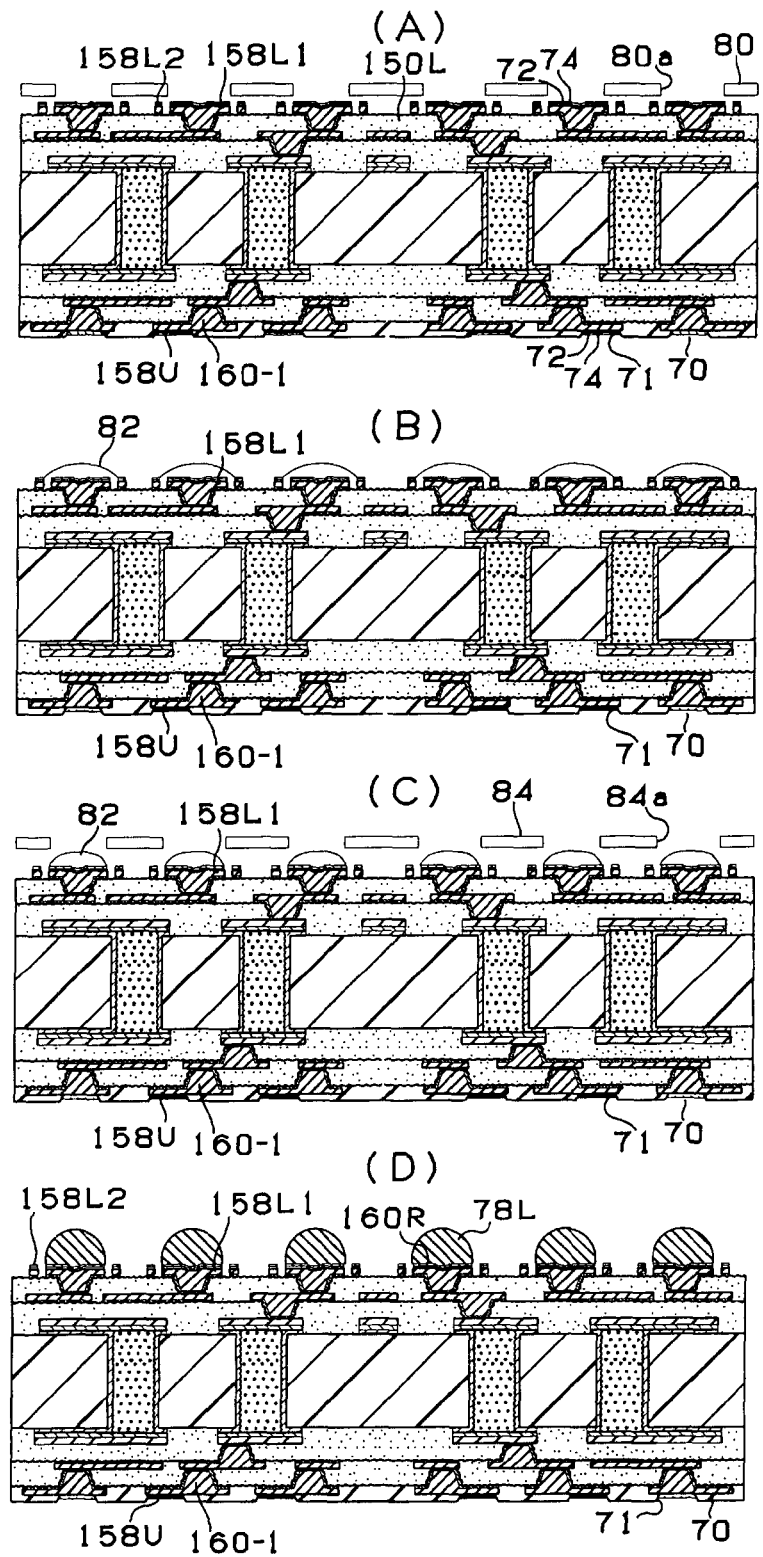
FIGS. 7(A)-(D) are views showing steps of a method for manufacturing a multilayer printed wiring board according to the first embodiment.

The embodiments will now be described with reference to the accompanying drawings, wherein like reference numerals designate corresponding or identical elements throughout the various drawings.

First Embodiment

Figure 8:
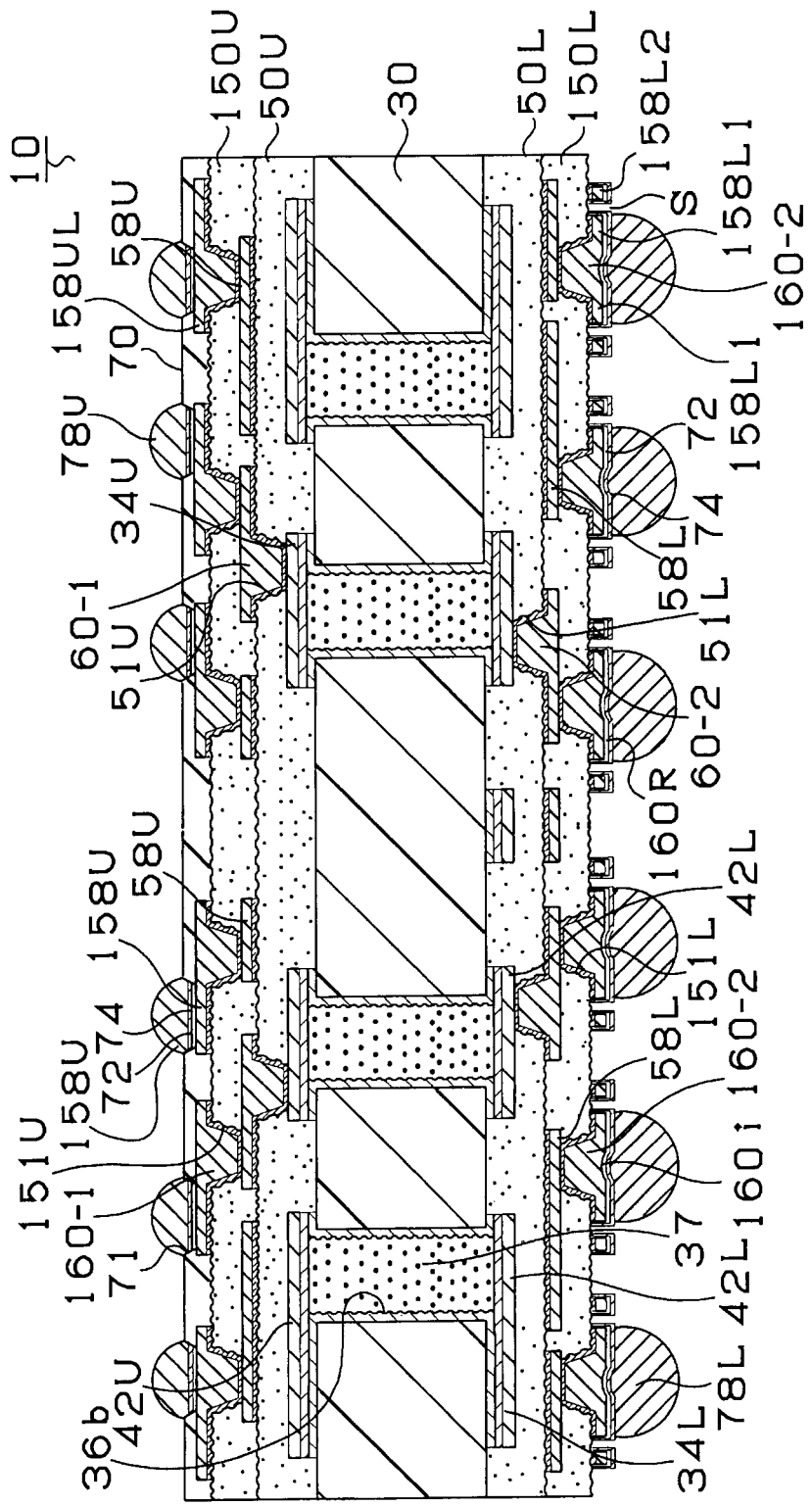
FIG. 8 is a cross-sectional view showing a multilayer printed wiring board according to the first embodiment.

The structure of multilayer printed wiring board 10 manufactured by the manufacturing method according to the first embodiment of the present invention is described with reference to FIG. 8. FIG. 8 shows a cross-sectional view of multilayer printed wiring board 10. As shown in FIG. 8, conductive circuits (34U, 34L) are formed on an upper surface (first surface) and a lower surface (second surface) of insulative substrate 30 in multilayer printed wiring board 10. Conductive circuit (34U) on the upper surface of insulative substrate 30 and conductive circuit (34L) on the lower surface are connected by through-hole conductor (36b). Lower interlayer resin insulation layers (50U, 50L) are formed on both surfaces of insulative substrate 30.

Lower interlayer resin insulation layers (50U, 50L) indicate first lower interlayer resin insulation layer (50U) and second lower interlayer resin insulation layer (50L). First lower interlayer resin insulation layer (50U) having a first surface and a second surface is formed on the upper surface of the core substrate, and second lower interlayer resin insulation layer (50L) having a first surface and a second surface is formed on the lower surface of the core substrate. A first surface is the surface facing the core substrate and a second surface is the surface opposite the first surface. First lower conductive circuit (58U) is formed on first lower interlayer resin insulation layer (50U), and second lower conductive circuit (58L) is formed on second lower interlayer resin insulation layer (50L). First lower interlayer resin insulation layer (50U) has first opening (51U) which penetrates through the first lower interlayer resin insulation layer, and second lower interlayer resin insulation layer (50L) has second opening (51L) which penetrates through the second lower interlayer resin insulation layer. First via conductor (60-1) filled in first opening (51U) connects conductive circuit (34U) on the core substrate and conductive circuit (58U) on first lower interlayer resin insulation layer (50U). Second via conductor (60-2) filled in second opening (51L) connects conductive circuit (34L) on the core substrate and conductive circuit (58L) on second lower interlayer resin insulation layer (50L). First upper interlayer resin insulation layer (150U) having a first surface and a second surface is formed on first lower interlayer resin insulation layer (50U) and conductive circuit (58U), and second upper interlayer resin insulation layer (150L) having a first surface and a second surface is formed on second lower interlayer resin insulation layer (50L) and conductive circuit (58L).

The first surface of first upper interlayer resin insulation layer (150U) is the surface opposite the second surface of first lower interlayer resin insulation layer (50U), and the second surface of first upper interlayer resin insulation layer (150U) is the surface opposite the first surface of the first upper interlayer resin insulation layer. The first surface of second upper interlayer resin insulation layer (150L) is the surface opposite the second surface of the second lower interlayer resin insulation layer, and the second surface of second upper interlayer resin insulation layer (150L) is the surface opposite the first surface of the second upper interlayer resin insulation layer. Via land (158UL) and upper conductive circuit (158U) are formed on the second surface of first upper interlayer resin insulation layer (150U). First upper interlayer resin insulation layer (150U) has third opening (151U) which penetrates through the first upper interlayer resin insulation layer, and second upper interlayer resin insulation layer (150L) has fourth opening (151L) which penetrates through the second upper interlayer resin insulation layer. Third via conductor (160-1), which is filled in third opening (151U) and which connects first lower conductive circuit (58U) or first via conductor (60-1) and via land (158UL) or upper conductive circuit (158U), is formed in first upper interlayer resin insulation layer (150U). Via land (158UL) is the portion which is formed around third via conductor (160-1) and is directly connected to third via conductor (160-1). First land (158L1) and second land (158L2) are formed on the second surface of second upper interlayer resin insulation layer (150L). Fourth via conductor (160-2), which is filled in fourth opening (151L) and connects second lower conductive circuit (58L) or second via conductor (60-2) and first land (158L1), is formed in second upper interlayer resin insulation layer (150L). First land (158L1) is the portion which is formed around fourth via conductor (160-2) and is directly connected to fourth via conductor (160-2).

Second land (158L2) surrounds first land (158L1) with space (S) therebetween. Solder-resist layer 70 is formed on the second surface of first upper interlayer resin insulation layer (150U), third via conductor (160-1) and upper conductive circuit (158U). The solder-resist layer has openings (71) which expose first solder pads. Openings 71 expose top surfaces of third via conductor (160-1) and upper conductive circuit (158U). The top surfaces of third via conductor (160-1) and upper conductive circuit (158U) exposed through openings 71 function as first solder pads.

In the present embodiment, second upper interlayer resin insulation layer (150L) corresponds to an outermost interlayer resin insulation layer, and second lower interlayer resin insulation layer (50L) corresponds to an insulation layer. Also, in the first embodiment, the second surface of second upper interlayer resin insulation layer (150L) is left exposed by first land (158L1) and second land (158L2). Except for the portions where first land (158L1) and second land (158L2) are formed, the second surface of the second upper interlayer resin insulation layer is exposed to the outside. Other than first land (158L1) and second land (158L2), conductive circuits and solder-resist layer 70 are not formed on the second surface of the second upper interlayer resin insulation layer.

FIG. 9(A) shows a plan view of fourth via conductor (160-2), first land (158L1) and second land (158L2) in FIG. 8. Second solder bump (78L) is formed on second solder pad (160R) made up of fourth via conductor (160-2) and first land (158L1). Annular second land (158L2) is formed around first land (158L1) with space (S) therebetween. The portion inside broken line (L) is fourth via conductor (160-2) and the portion outside broken line (L) is first land (158L1). Second land (158L2) is not connected to other conductive circuits on the second surface of the second upper interlayer resin insulation layer. Diameter (V) of fourth via conductor (160-2) is 30~150 μm, diameter (R1) of first land (158L1) is 40~190 μm, internal diameter (D1) of second land (158L2) is 52~340 μm, external diameter (D2) of second land (158L2) is 64~490 μm, the width of second land (158L2) is 12~150 μm, and width (G) of space (S) is 12~150 μm. Diameter (V) of the fourth via conductor is the same as the diameter of the fourth opening on the second surface of the second upper interlayer resin insulation layer. Also, the diameter of each via conductor is the same as the diameter of each opening on the second surface of each interlayer resin insulation layer.

If a device (such as a cell phone) containing printed wiring board 10 is dropped, impact waves is transmitted along surfaces of the printed wiring board. In multilayer printed wiring board 10 of the first embodiment, second land (158L2) is formed around second solder pad (160R) which is made up of fourth via conductor (160-2) and first land (158L1). When impact waves which are transmitted along the surfaces of printed wiring board 10 reach second land (158L2), second land (158L2) functions as a levee. Thus, second land (158L2) stops impact waves from proceeding further, or second land (158L2) weakens the intensity of the impact waves. Second land (158L2) weakens the intensity of the impact waves that reach second solder pad (160R) formed inside second land (158L2). Accordingly, in a printed wiring board of the first embodiment, chances are low for solder bump (78L) to be detached from second solder pad (160R) due to impact such as being dropped, and connection reliability is enhanced.

Since the second land works as a dam, the solder bump on second solder pad (160R) seldom crosses over the second land. Thus, short circuiting through the solder between adjacent second solder pads is prevented. Since the outermost interlayer resin insulation layer, on which it is hard to wet the solder, exists between second solder pad (160R) and second land (158L2), a solder bump is formed on a second solder pad. In the first embodiment, if second solder pads are formed at a fine pitch and tall solder bumps with a greater volume are formed on second solder pads, such a solder bump seldom short circuit with another solder bump.

In the following, a method for manufacturing multilayer printed wiring board 10 shown in FIG. 8 is described with reference to FIGS. 1-7.

(1) As a starting material, copper-clad laminate (30A) is prepared, where 5~25 μm-thick copper foil 32 is laminated on both surfaces of insulative substrate 30 made of epoxy resin or BT (bismaleimide triazine) resin with a thickness of 0.2~0.8 mm (FIG. 1(A)). Insulative substrate 30 is preferred to contain a core material such as glass cloth. First, a penetrating hole for through-hole conductor (through-hole conductor penetrating hole) 33 is formed in copper-clad laminate (30A) using a drill or a laser (FIG. 1(B)). Then, by performing electroless plating and electrolytic plating, through-hole conductor (36b) is formed on the side wall of penetrating hole 33 (FIG. 1(C)). Conductive film 36 made up of electroless plated film and electrolytic plated film is simultaneously formed on the copper foils. As shown in FIG. 1(C), penetrating hole 34 is not filled with metal in the first embodiment. A printed wiring board according to the first embodiment has penetrating hole (36A) inside a through-hole conductor.

Roughened surface (36α) is formed on surfaces of through-hole conductor (36b) and conductive film 36 (FIG. 1(D)).

(2) Next, resin filler 37 containing inorganic particles such as glass with an average particle diameter of 3~5 μm is filled in penetrating hole (36A) inside a through-hole conductor, then the filler is dried and cured (FIG. 2(A)).

Then, resin filler 37 bulging out of penetrating hole (36A) inside a through-hole conductor is removed by polishing to level the surfaces of substrate 30. Penetrating hole (36A) inside a through-hole conductor is filled with resin filler 37 (FIG. 2(B)).

(3) After that, a palladium catalyst (made by Atotech) is attached to the surfaces of substrate 30 and electroless copper plating is performed. Accordingly, electroless copper-plated films 23 with a thickness of 0.2~2 μm are formed (FIG. 2(C)). Then, electrolytic copper plating is performed to form 15 μm-thick electrolytic copper-plated films 24. Plated film made up of electroless copper-plated film 23 and electrolytic copper-plated film 24 is formed on copper foils 32. At the same time, the plated film covers through-hole conductor (36b) and resin filler 37 (FIG. 2(D)).

(4) A commercially available dry film is laminated on both surfaces of substrate 3000 having plated films. After that, using a photolithographic technique, etching resists 25 are formed on plated films (FIG. 2(E)). Then, the plated film, conductive film 36, and copper foil 32 exposed from the etching resists are dissolved and removed by using an etching solution, and the etching resists are further removed (FIG. 3(A)). Upper-surface conductive circuit (34U) is formed on the first surface of insulative substrate 30, and lower-surface conductive circuit (34L) is formed on the second surface of insulative substrate 30. At the same time, upper-surface coating circuit (42U) and lower-surface coating circuit (42L) are formed, covering filler 37 (FIG. 3(A)). Core substrate 300 is completed, formed with insulative substrate 30, upper-surface conductive circuit (34U), lower-surface conductive circuit (34L), through-hole conductor (36b) and coating circuits (42U, 42L) (FIG. 2(B)). Then, by roughening the surfaces of upper-surface conductive circuit (34U), lower-surface conductive circuit (34L), lower-surface coating circuit (42L) and upper-surface coating circuit (42U), roughened surfaces are formed (not shown in the drawings). Upper-surface coating circuits are included in upper-surface conductive circuits, and lower-surface coating circuits are included in lower-surface conductive circuits.

Forming Buildup Layers (5) Resin film for interlayer resin insulation layers (brand name ABF-45SH, made by Ajinomoto) is laminated on both surfaces of core substrate 300. Then, by curing the resin film for interlayer resin insulation layers, lower interlayer resin insulation layers (50U, 50L) are formed on both surfaces of the core substrate (FIG. 2(B)). The lower interlayer resin insulation layer formed on the upper surface of the core substrate is first lower interlayer resin insulation layer (50U). First lower interlayer resin insulation layer (50U) has a first surface and a second surface opposite the first surface. The first surface of first lower interlayer resin insulation layer (50U) is the surface facing the core substrate. The lower interlayer resin insulation layer formed on the lower surface of the core substrate is second lower interlayer resin insulation layer (50L). Second lower interlayer resin insulation layer (50L) has a first surface and a second surface opposite the first surface. The first surface of first lower interlayer resin insulation layer (50L) is the surface facing the core substrate.

(6) Next, using a $CO_2$ gas laser, via-conductor openings (51U, 51L) with a diameter of 30~150 μm are formed in lower interlayer resin insulation layers (50U, 50L) (FIG. 3(C)). First lower interlayer resin insulation layer (50U) has first opening (51U) which penetrates through first lower interlayer resin insulation layer (50U) and reaches upper-surface conductive circuit (34U) or upper-surface coating circuit (42U). Second lower interlayer resin insulation layer (50L) has second opening (51L) which penetrates through second lower interlayer resin insulation layer (50L) and reaches lower-surface conductive circuit (34L) or lower-surface coating circuit (42L). The substrate having via-conductor openings (51U, 51L) is immersed for 10 minutes in an 80° C. solution containing 60 g/l permanganic acid to roughen the surfaces of lower interlayer resin insulation layers (50U, 50L) including the inner walls of via-conductor openings (51U, 51L) (FIG. 4(A)).

(7) Next, the substrate having via-conductor openings (51U, 51L) is immersed in a neutralizer (made by Shipley Company) and washed with water. Moreover, a catalyst is attached to the surfaces of interlayer resin insulation layers (50U, 50L) and to the inner walls of via-conductor openings (51U, 51L) (not shown in the drawings).

(8) Next, the substrate is immersed in a commercially available electroless plating solution to form 0.3~3.0 μm-thick electroless plated film 52 on the surfaces of the interlayer resin insulation layers and on the inner walls of the via-conductor openings (FIG. 4(B)). As for electroless plated film, copper, nickel or the like may be listed. The electroless plated film of the present embodiment is electroless copper-plated film. Instead of electroless plated film, vapor deposition film such as sputtered film may be formed on the interlayer resin insulation layers and via-conductor openings.

(9) Then, plating resists 54 with predetermined patterns are formed on electroless copper-plated films 52.

(10) Next, the substrate is immersed in a commercially available electrolytic copper plating solution (such as a plating solution made by C. Uyemura & Co., Ltd.). Using the electroless copper-plated film as a seed layer, electrolytic copper-plated film 56 is formed on electroless copper-plated films exposed from the plating resists (FIG. 4(C)). Via-conductor openings are filled with electrolytic plated film 56. Instead of electrolytic copper-plated film, electrolytic nickel-plated film or electrolytic solder film may also be formed. The thickness of electrolytic plated film is 10~20 μm.

(11) The plating resists are removed and electroless copper-plated film 52 between portions of electrolytic copper-plated film is etched away. First lower conductive circuit (58U) is formed on the second surface of the first lower interlayer resin insulation layer. First via conductor (60-1) filled in first opening (51U) is formed in the first lower interlayer resin insulation layer. First via conductor (60-1) connects upper-surface conductive circuit (34U) or upper-surface coating circuit (42U) and first lower conductive circuit (58U). Second lower conductive circuit (58L) is formed on the second surface of the second lower interlayer resin insulation layer. Second via conductor (60-2) filled in second opening (51L) is formed in the second lower interlayer resin insulation layer. Second via conductor (60-2) connects lower-surface conductive circuit (34L) or lower-surface coating circuit (42L) and second lower conductive circuit (58L).

Next, surfaces of the first lower conductive circuit, second lower conductive circuit, first via conductor and second via conductor are roughened (not shown in the drawings). After that, resin film for interlayer resin insulation layers (brand name ABF-45SH, made by Ajinomoto) is laminated on first lower interlayer resin insulation layer (50U), first lower conductive circuit (58U) and first via conductor (60-1). Resin film for interlayer resin insulation layers is also laminated on second lower interlayer resin insulation layer (50L), second lower conductive circuit (58L) and second via conductor (60-2). After that, by curing the resin films for interlayer resin insulation layers, upper interlayer resin insulation layers (150U, 150L) are formed on the lower interlayer resin insulation layers (FIG. 5(A)).

The interlayer resin insulation layer formed on first lower interlayer resin insulation layer (50U) is first upper interlayer resin insulation layer (150U). First upper interlayer resin insulation layer (150U) has a first surface and a second surface opposite the first surface. The first surface of first upper interlayer resin insulation layer (150U) is the surface facing the second surface of first lower interlayer resin insulation layer (50U). The interlayer resin insulation layer formed on second lower interlayer resin insulation layer (50L) is second upper interlayer resin insulation layer (150L). Second upper interlayer resin insulation layer (150L) has a first surface and a second surface opposite the first surface. The first surface of second upper interlayer resin insulation layer (150L) is the surface facing the second surface of second lower interlayer resin insulation layer (50L).

(6) Next, using a $CO_2$ laser, via-conductor openings (151U, 151L) with a diameter of 30~150 μm are formed in upper interlayer resin insulation layers (150U, 150L). First upper interlayer resin insulation layer (150U) has third opening (151U) which penetrates through first upper interlayer resin insulation layer (150U) and reaches first lower conductive circuit (58U) or first via conductor (60-1). Second upper interlayer resin insulation layer (150L) has fourth opening (151L) which penetrates through second upper interlayer resin insulation layer (150L) and reaches second lower conductive circuit (58L) or second via conductor (60-2). Second surfaces of upper interlayer resin insulation layers (150U, 150L) are roughened the same as second surfaces of lower interlayer resin insulation layers (FIG. 5(B)).

Then, the substrate having via-conductor openings (151U, 151L) is immersed in a neutralizer (made by Shipley Company) and washed with water. Moreover, a catalyst is attached to the surfaces of upper interlayer resin insulation layers (150U, 150L) and to the inner walls of via-conductor openings (151U, 151L). Next, the substrate is immersed in a commercially available electroless plating solution to form electroless plated films (152U, 152L) with a thickness of 0.3~3.0 μm on the surfaces of interlayer resin insulation layers and on the inner walls of via-conductor openings (FIG. 5(C)). As for electroless plated film, copper, nickel and the like may be listed. The electroless plated film of the present embodiment is electroless copper-plated film. Instead of electroless plated film, vapor deposition film such as sputtered film may be formed on interlayer resin insulation layers and via-conductor openings.

Next, plating resists 154 with predetermined patterns are formed on electroless copper-plated films (152U, 152L) (FIG. 5(D)). FIG. 10(A) shows electroless plated film (152L) formed on the second surface of second upper interlayer resin insulation layer (150L). Plating resist (154L) formed on electroless plated film (152L) is described in the following.

FIG. 10(A) shows a cross-sectional view of plating resist (154L). FIG. 10(B) shows a plan view of plating resist (154L). Broken line (L) in FIG. 10(B) indicates the periphery of fourth opening (151L) on the second surface of the second upper interlayer resin insulation layer.

Fourth opening (151L) and circumferential portion (M) of fourth opening (151L) are exposed from plating resist (154L).

In FIG. 10(A) and FIG. 10(B), (m) indicates the width of circumferential portion (M), and plating resist (154L-1W) having width (W1) is formed outside circumferential portion (M). Outside plating resist (154L-1W), electroless plated film (152LL) having width (N) is exposed from plating resist (154L). Electroless plated film (152L) outside electroless plated film (152LL) having width (N) is covered with plating resist (154L). The (m) is 10~150 µm, (W1) is 10~155 µm, and (N) is 10~155 µm.

FIG. 11(A) shows electroless plated film (152U) on the second surface of first upper interlayer resin insulation layer (150U). Plating resist (154U) formed on electroless plated film (152U) is described in the following.

FIG. 11(A) shows a cross-sectional view of plating resist (154U), and FIG. 11(B) shows a plan view of plating resist (154U). FIG. 11(A) is a cross-sectional view taken at (A'-A') in FIG. 11(B). Broken line (L2) in FIG. 11(B) indicates the periphery of third opening (151U) on the second surface of the first upper interlayer resin insulation layer. Electroless plated film (152U) surrounding third opening (151U) is exposed from plating resist (154U) for forming via land (158UL). On the right side of FIG. 11(B), substantially circular exposed portion (E2), which is exposed from plating resist (154U), exists in addition to third opening (151U). Substantially linear exposed portion (E3), which is exposed from plating resist (154U), exists between exposed portion (E1), which includes third opening (151U), and exposed portion (E2). By forming electrolytic plated film in such exposed portions, solder pads, conductive circuits, via conductors and via lands are formed.

Next, the substrate is immersed in a commercially available electrolytic copper plating solution (such as a plating solution made by C. Uyemura & Co., Ltd.). Using the electroless copper-plated film as a seed layer, electrolytic copper-plated film 156 is formed on electroless copper-plated films exposed from plating resists (154U, 154L) (FIG. 6(A)). Via-conductor openings are filled with electrolytic plated film 156. Instead of electrolytic copper-plated film, electrolytic nickel film or electrolytic solder film may be formed. The thickness of electrolytic plated film on the second surfaces of upper interlayer resin insulation layers is 10~20 µm.

Plating resists (154U, 154L) are removed, and electroless copper-plated film 152 between portions of electrolytic copper-plated film 156 is etched away. Upper conductive circuit (158U) and via land (158UL) are formed on the second surface of the first upper interlayer resin insulation layer (FIG. 6(B)). Third via conductor (160-1) filled in third opening (151U) is formed in the first upper interlayer resin insulation layer. Third via conductor (160-1) connects first lower conductive circuit (58U) or a first via conductor and upper conductive circuit (158U) or via land (158UL). Via land (158UL) is formed around a third via conductor and is directly connected to the third via conductor. Via land (158UL) is formed with the plated film which is made up of electroless plated film and electrolytic plated film formed in exposed portion (E1) (see FIG. 11(B)) positioned outside broken line (L2). Upper conductive circuit (158U) is formed with the plated film which is made up of electroless plated film and electrolytic plated film formed in exposed portion (E3) (see FIG. 11(B)). A pad is formed with the plated film which is made up of electroless plated film and electrolytic plated film formed in exposed portion (E2) (see FIG. 11(B)). The top surface of a third via conductor is used as a first solder pad, and the top surface of a pad is used as a first solder pad. The thickness of conductive circuits and pads is 10~20 µm. Top surfaces of via conductors and pads and top surfaces of conductive circuits are positioned on substantially the same plane.

First land (158L1) and second land (158L2) are formed on the second surface of second upper interlayer resin insulation layer (150L). Fourth via conductor (160-2) filled in fourth opening (151L) is formed in second upper interlayer resin insulation layer (150L). Fourth via conductor (160-2) connects second lower conductive circuit (158L) or second via conductor and first land (158L1). First land (158L1) is formed around fourth via conductor (160-2) and is directly connected to the fourth via conductor.

If top surfaces of third via conductor (160-1) and fourth via conductor (160-2) are used as solder pads, it is preferred that top surfaces of third via conductor (160-1) and fourth via conductor (160-2) be recessed (see FIG. 6(B)). Depth (K) of recess (160i) is preferred to be 1~7 µm. Depth (K) of a recess is the distance from the bottom of the recess to the top surface of a first land or a via land (see FIG. 12(A)). If the top surface of a solder pad is recessed, a solder bump seldom moves from a predetermined solder pad to another solder pad during the reflow process. Also, the solder bump seldom falls from the solder pad. Thus, it is easier to form a solder bump on a solder pad. If a second solder pad is made from a via conductor having a recess, a solder bump is easier to form on the second solder pad, since there is a second land around the via conductor. Since a second land is made of plated film, a solder bump is easily wetted on the second land. Since a second land and a solder bump are adhered, the solder bump seldom crosses over the second land to move from the predetermined second solder pad to another solder pad.

(16) Next, on the second surface of first upper interlayer resin insulation layer (150U), upper conductive circuit (158U) and third via conductor (160-1), commercially available solder-resist composition 70 is applied to be 15~25 µm thick and dried. Then, the composition is exposed to light, developed and cured. Solder-resist layer 70 having openings 71 is obtained (FIG. 6(C)). The thickness of the solder-resist layer is 15-25 µm. Openings 71 expose the top surface of third via conductor (160-1) and the top surface of pad (P). The top surface of third via conductor (160-1) and the top surface of pad (P) exposed through openings 71 functions as solder pads (first solder pads). To form openings 71 in the solder-resist layer, the catalyst attached to the second surface of the second upper interlayer resin insulation layer may be removed.

A solder-resist layer is not formed on the second surface of second upper interlayer resin insulation layer (150L). When forming a solder-resist layer on first upper interlayer resin insulation layer (150U), a protective film may be laminated on the second surface of second upper interlayer resin insulation layer (150L). If a protective film is formed, the protective film is required to be removed before forming a metal film on second solder pads.

(18) Next, the substrate is immersed in an electroless nickel plating solution to form nickel-plated layer 72 on the top surface of a first solder pad, surfaces (top surface and side surface) of a second solder pad made up of a fourth via conductor and a first land, and surfaces (top and side surfaces) of a second land. The thickness of the nickel-plated layer is 1~5 µm. Moreover, the substrate is immersed in an electroless gold plating solution to form gold-plated layer 74 on nickel-plated layer 72. The thickness of the gold-plated layer is 0.03~3 µm. A metal layer made up of nickel-plated layer 72 and gold-plated layer 74 is formed on a first solder pad, second solder pad and second land (FIG. 6(D)). A metal layer made up of a nickel layer, a palladium layer on the nickel layer and a gold layer on the palladium layer may be formed on a solder pad and a second land. Before forming a metal layer, a protective film may be formed on the solder-resist layer, and the catalyst attached to the second surface of the second upper interlayer resin insulation layer may be removed. Then, the protective film on the solder-resist layer is removed, and a metal layer is formed on a first solder pad, second solder pad and second land. The catalyst may be removed by immersing the substrate with attached catalyst in a permanganic acid solution.

(19) Mask 80 is prepared, which has opening (80a) corresponding to a second solder pad. The diameter of opening (80a) is set smaller than the diameter of a second solder pad. The diameter of opening (80a) divided by the diameter of a second solder pad is preferred to be 0.5~0.9. The accuracy required to align mask opening (80a) and a second solder pad may be set low. When a second solder pad and opening (80a) are aligned, mask 80 is fixed onto second upper resin insulation layer (150L) (FIG. 7(A)). Flux 82 is applied to a second pad through opening (80a). Since flux 82 is liquid, it wets the second solder pad and spreads out. Since a second land is positioned around a second pad with space (S) therebetween, flux 82 seldom crosses over the second land. Thus, flux 82 tends to remain inside second land (158L2) as shown in FIG. 12(B). Next, mask 80 is removed. Mask 84 for loading solder balls is prepared. Mask 84 for loading solder balls has opening (84a) in a position corresponding to a second solder pad. When a second solder pad and an opening of a mask for loading solder balls are aligned, mask 84 for loading solder balls is fixed to the second upper interlayer resin insulation layer.

Then, using a method for loading solder balls described in U.S. 2006/0157540 (A1), solder balls are loaded on second solder pads. A solder ball is fixed to the second solder pad by the adhesive strength of flux. During that time, since flux 82 is formed inside the second land, the possibilities are low for the solder ball to be loaded on portions other than the second solder pad. If a second solder pad has a recess, a solder ball seldom rolls down from the second solder pad. In addition, flux 82 seldom crosses over the second land. Then, second solder bump (78L) is formed on second solder pad (160R) through a reflow process. As described above, since a printed wiring board according to the first embodiment has second lands, even if there is no solder-resist layer formed on the second surface of the second upper interlayer resin insulation layer, second solder bumps are formed on second solder pads.

Next, a mask having an opening in a position facing a first solder pad is fixed onto solder-resist layer 70. Using a printing method, solder paste is printed on a portion which is on a solder pad as well as inside opening 71 of the solder-resist layer. Then, first solder bump (78U) is formed on a first solder pad through a reflow process (FIG. 8). The melting point of first solder bump (78U) is set lower than the melting point of a second solder bump. As a combination example of a first solder bump and a second solder bump, a combination such as Sn/Pb for a first solder bump and Sn/Ag for a second solder bump may be used. As for another example, a combination such as Sn/Pb for a first solder bump and Sn/Cu for a second solder bump may be used.

In a printed wiring board according to the first embodiment, solder-resist layer 70 is formed on the first upper interlayer resin insulation layer. Therefore, conductive circuit (158U) is formed on first upper interlayer resin insulation layer (150U).

A printed wiring board according to the first embodiment does not have a solder-resist layer on the second surface of the second upper interlayer resin insulation layer, but does have a second land around a second solder pad. Thus, a tall solder bump is formed on a second solder pad. FIG. 13(A) shows an example in which tall solder bump (78L) is formed on second solder pad (160R). FIG. 13(B) shows an example in which tall solder bump (78U) is formed on a first solder pad. The diameter of a second solder pad in FIG. 13(A) is the same as the diameter of a first solder pad in FIG. 13(B). In addition, the volume of the second solder bump in FIG. 13(A) is the same as the volume of the first solder bump in FIG. 13(B). If the height of a solder bump on a first solder pad increases, the solder bump tends to bend at the corner (portion X) of the opening in the solder-resist layer as shown in FIG. 13(B). By contrast, a solder bump on a second solder pad seldom has a bent portion as shown in FIG. 13(B). As a result, stress generated between printed wiring board 10 and external substrate (motherboard) 94 or between printed wiring board 10 and an electronic component is absorbed by the second solder bump. Connection reliability is enhanced between printed wiring board 10 and external substrate 94 or between printed wiring board 10 and an electronic component. When forming a tall solder bump on a solder pad, a second solder pad has advantages over a first solder pad.

If the diameter of a solder bump becomes greater than the diameter of a solder pad, the above-described problems tend to occur. Therefore, if the diameter of a solder bump is greater than that of a solder pad, a second solder pad is preferred to be used as the solder pad.

Since the number of second solder pads is less than the number of first solder pads, forming conductive circuits on the second surface of the second upper resin insulation layer is less likely required. Thus, forming a solder-resist layer on the second surface of the second upper resin insulation layer is less likely required.

In a printed wiring board according to the first embodiment, outermost interlayer resin insulation layer (second upper interlayer resin insulation layer) (150L) is preferred to be formed with inorganic particles and resin.

When a first solder pad and a second solder pad are made from via conductors and the via conductors have recesses (160i), the adhesiveness is high between solder bumps and solder pads.

According to a printed wiring board and its manufacturing method in the first embodiment, a second land is formed around a second solder pad. Thus, a solder bump on the solder pad seldom moves outside the second land during a reflow process. Accordingly, even if tall solder bumps with a greater volume are formed on second solder pads positioned at a narrower pitch, a solder bump seldom short-circuits with another solder bump.

In a method for manufacturing a printed wiring board according to the first embodiment, solder balls are loaded on second pads using mask 80. Therefore, the supply of solder is constant and solder bumps (78L) with a uniform height are formed.

First Modified Example of the First Embodiment

FIG. 9(B) shows a plan view of a second solder pad and second land (158L2) in a printed wiring board according to the first modified example of the first embodiment. In the first embodiment, second land (158L2) is formed to be independent of another conductive circuit and a first land as shown in FIG. 9(A). By contrast, in the first modified example of the first embodiment, second solder pad (160R) and second land (158L2) are connected by short-circuit wiring (159a). The short-circuit wiring is formed in the space. A printed wiring board according to the first modified example of the first embodiment has short-circuit wiring, which is an addition to a printed wiring board according to the first embodiment. Except for short-circuit wiring (159a), the printed wiring board according to the first modified example of the first embodiment is the same as the printed wiring board in the first embodiment.

In a printed wiring board according to the first modified example of the first embodiment, second solder pad (160R) and annular second land (158L2) are connected by short-circuit wiring (159a). Accordingly, second land (158L2) does not become isolated. There are no independent second lands. If high-frequency signals are transmitted through a second solder pad, noise is less likely to be added to signals in a printed wiring board according to the first modified example of the first embodiment than in a printed wiring board according to the first embodiment. Therefore, a printed wiring board according to the first modified example of the first embodiment is a printed wiring board suitable for high-speed signal transmission.

Second Modified Example of the First Embodiment

Figure 14:
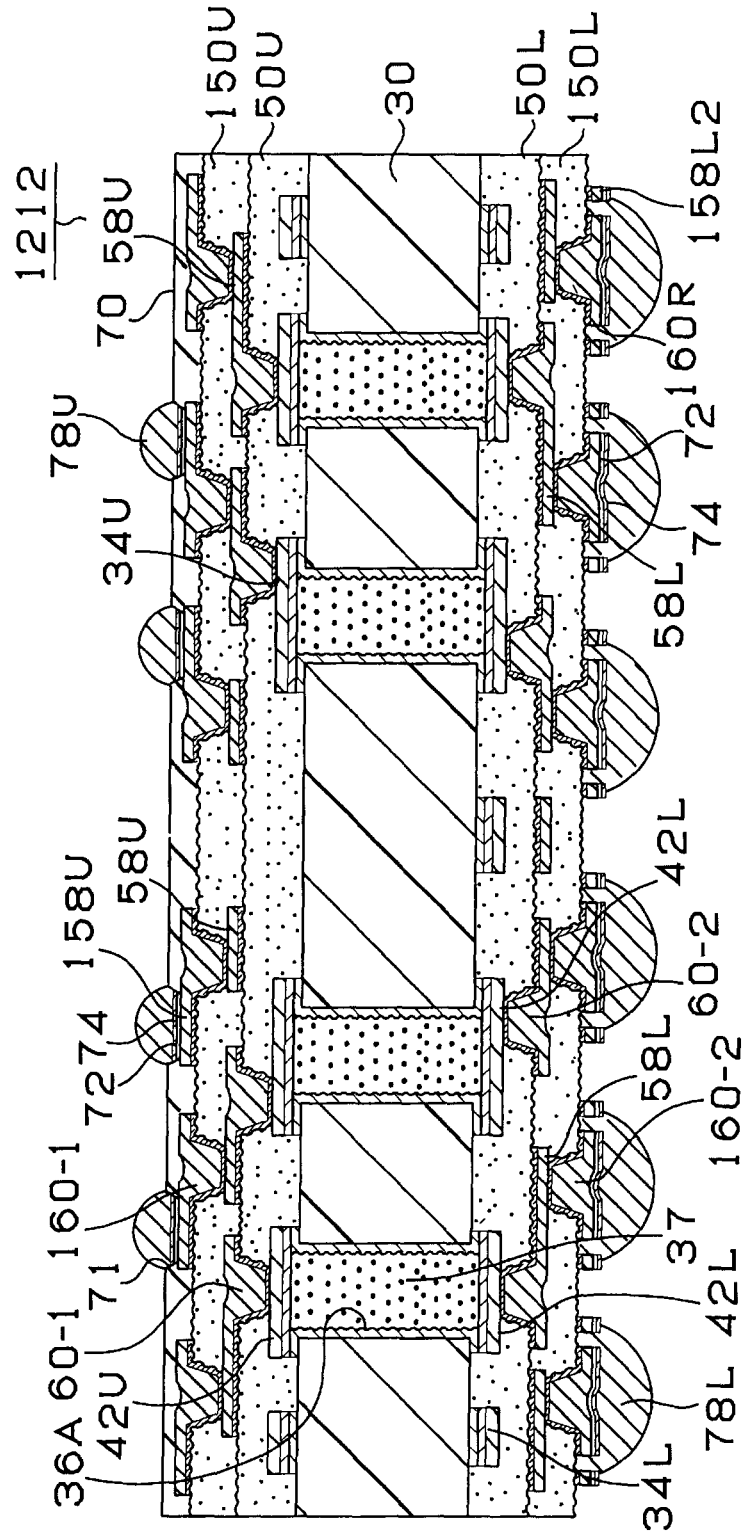
FIG. 14 is a cross-sectional view showing a multilayer printed wiring board according to a second modified example of the first embodiment.

FIG. 14 shows a cross-sectional view of multilayer printed wiring board 1212 according to the second modified example of the first embodiment. In the second modified example of the first embodiment, second solder bump (78L) is formed on second solder pad (160R) and second land (158L2). In the first embodiment, the position of an opening in mask 80 and the position of a second solder pad are aligned, and a solder ball is loaded on the second pad. By contrast, in the second modified example of the first embodiment, the position of an opening in mask 80 and the position of a second solder pad are shifted (see FIG. 15(A)). By shifting the position of an opening in mask 80 and the position of a second solder pad, solder ball (86D) is loaded on the second solder pad and the second land (see FIG. 15(B)). Then, a second solder bump is formed on the second solder pad and the second land through a reflow process.

In a printed wiring board according to the second modified example of the first embodiment, a second solder pad and a second land are connected by a second solder bump. Thus, second land (158L2) does not become isolated. The same as in the first modified example of the first embodiment, the printed wiring board according to the second modified example of the first embodiment is a printed wiring board suitable for high-speed signal transmission. Also, since a second solder bump is connected to second land (158L2) in addition to a second solder pad, connection strength increases between the second solder bump and the second solder pad. If the printed wiring board according to the second modified example of the first embodiment receives an impact from being dropped or the like, the solder bump seldom falls off. The second solder bump is mainly formed on the second solder pad. The same as in the first embodiment, since a second land weakens the intensity of impact waves transmitted to a second solder pad, bonding strength between a second solder bump and a second solder pad is greater than that in a printed wiring board without second lands. In the first embodiment and its modified examples, a second upper interlayer resin insulation layer corresponds to an outermost interlayer resin insulation layer, and a second lower interlayer resin insulation layer corresponds to an insulation layer.

Applied Example of First Embodiment and its Modified Examples

Figure 16:
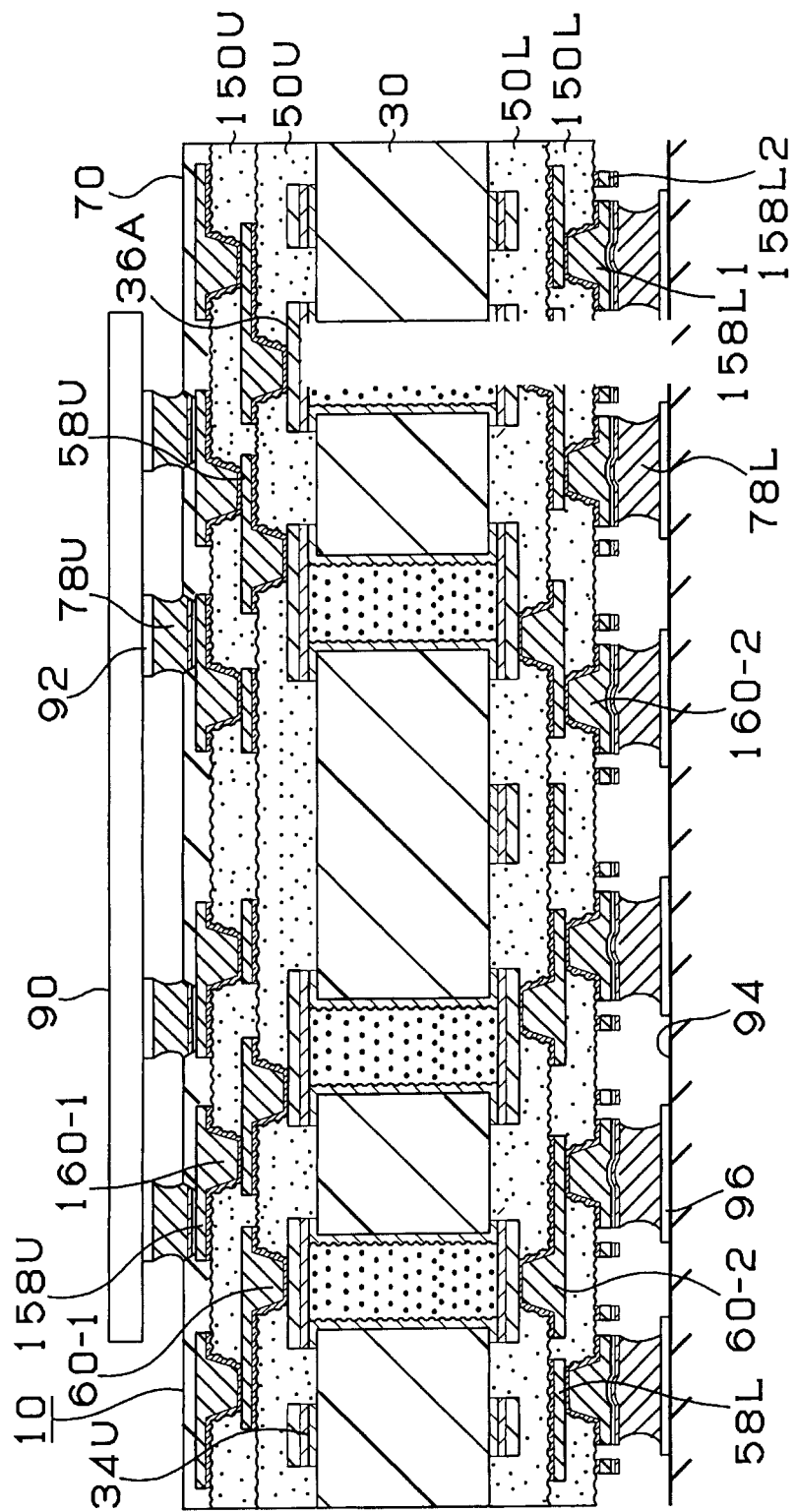
FIG. 16 is a cross-sectional view showing an IC chip mounted on the multilayer printed wiring board shown in FIG. 8.

FIG. 16 shows an applied example of the first embodiment and modified examples of the first embodiment. In the applied example of the first embodiment and modified examples of the first embodiment, a C4 surface is on the side of a first upper interlayer resin insulation layer, the side on which an electronic component such as IC chip 90 is flip-chip mounted. FIG. 16 shows a state where electronic component 90 such as an IC chip is mounted on multilayer printed wiring board 10 as shown in FIG. 8, and multilayer printed wiring board 10 is loaded on motherboard 94. As shown in FIG. 16, solder bump (78U) on the side of a first upper interlayer resin insulation layer in multilayer printed wiring board 10 is connected to electrode 92 of electronic component 90 such as an IC chip. On the other hand, solder bump (78L) on the side of a second upper interlayer resin insulation layer is connected to land 96 of motherboard 94. Since conductive circuits are formed on the second surface of the first upper interlayer resin insulation layer, an electronic component having a great number of terminals is mounted without increasing the number of interlayer resin insulation layers.

Although not shown in the drawing, encapsulating resin is filled between multilayer printed wiring board 10 and the IC chip, and the encapsulating resin is also filled between multilayer printed wiring board 10 and motherboard 94. In the present applied example, diameter (V) of fourth via conductor (160-2) is 60~150 μm. Width (L1W) of first land (158L1) is 10~40 μm. External diameter (L1D) is 80~200 μm. Width (W) of space (S) is 70~130 μm. Width (L2W) of second land (158L2) is 70~130 μm. The distance between adjacent second lands (158L2) is 70~130 μm.

Second Embodiment

Figure 17:
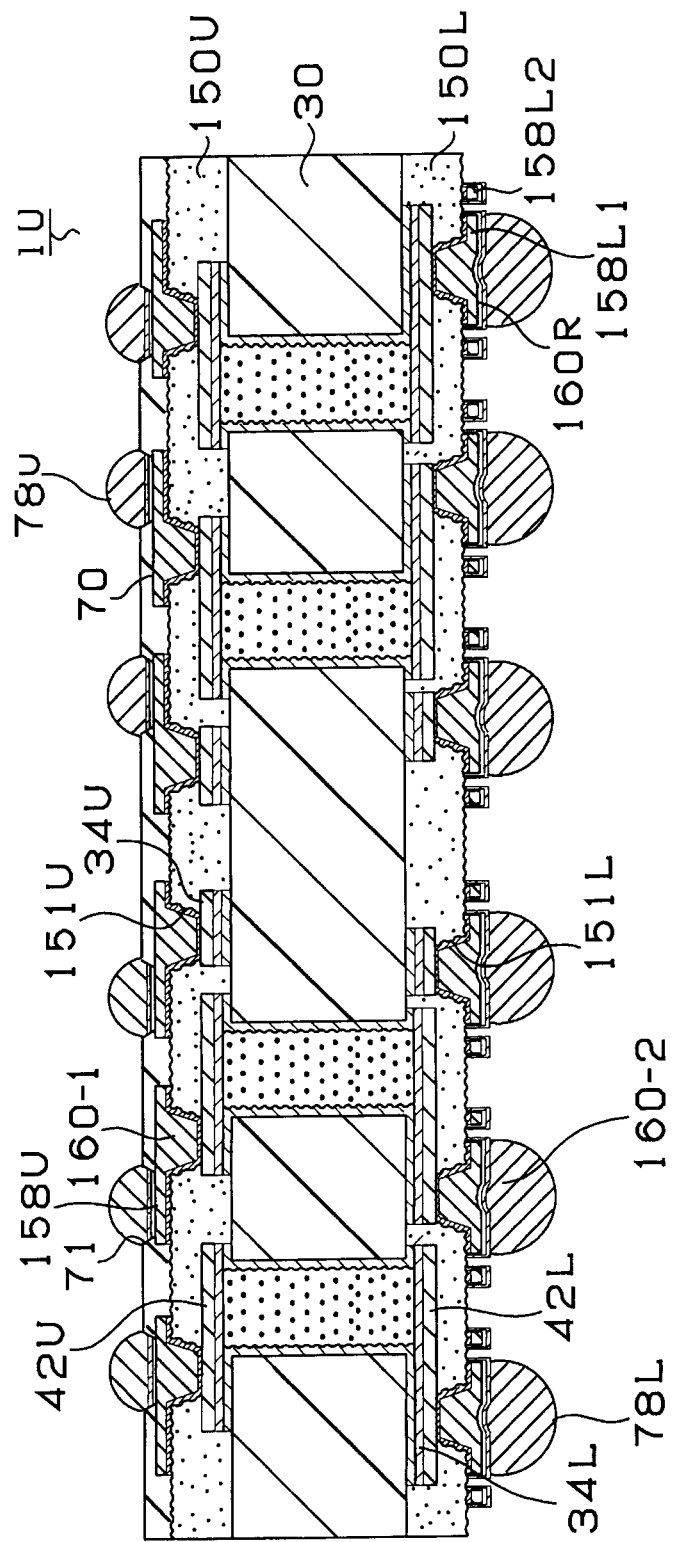
FIG. 17 is a cross-sectional view showing a printed wiring board according to the second embodiment.

A printed wiring board according to the second embodiment is shown in FIG. 17. The number of interlayer resin insulation layers in a printed wiring board according to the second embodiment is one layer less than that in a printed wiring board according to the first embodiment. Upper interlayer resin insulation layers 150 (first upper interlayer resin insulation layer (150U) and second upper interlayer resin insulation layer (150L)) are laminated on both surfaces of core substrate 300 shown in FIG. 3(A). Then, via-conductor openings 151 (third opening (151U), fourth opening (151L)) reaching conductive circuits (34U, 34L) or coating circuits (42U, 42L) on the core substrate are formed in upper interlayer resin insulation layers (150U, 150L). Then, procedures the same as those shown in FIG. 5(C) through FIG. 7 in the first embodiment are performed. In the second embodiment, a third via conductor is connected to conductive circuit (34U) or coating circuit (42U) on the core substrate. Also, a fourth via conductor is connected to conductive circuit (34L) or coating circuit (42L) on the core substrate. The conductors to which a third via conductor and a fourth via conductor are connected on the upper interlayer resin insulation layers are the same as those in the first embodiment. According to the second embodiment, the same printed wiring boards as those in the modified examples of the first embodiment are obtained.

In the second embodiment, second upper interlayer resin insulation layer (150L) corresponds to an outermost interlayer resin insulation layer, and insulative substrate 30 in the core substrate corresponds to an insulation layer. A printed wiring board according to the second embodiment is thinner than a printed wiring board according to the first embodiment.

Third Embodiment

A multi layer printed wiring board according to the third embodiment of the present invention is described with reference to FIG. 18 through FIG. 20.

In a multilayer printed wiring board according to the first embodiment, interlayer resin insulation layers and conductive circuits are laminated on both surfaces of a core substrate. By contrast, there is no core substrate in the third embodiment. The present embodiment relates to a coreless multilayer printed wiring board. A printed wiring board is made thinner according to the third embodiment.

Figure 18:
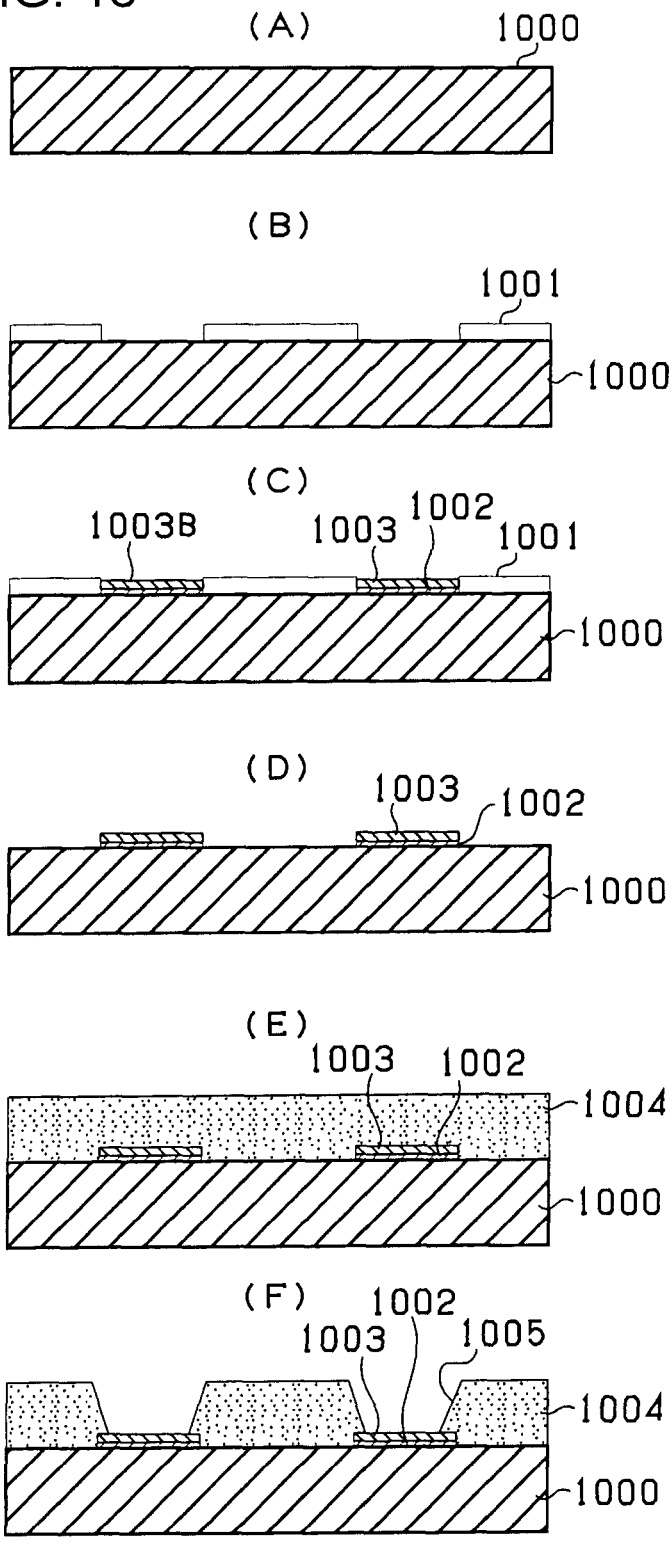
FIG. 18 is a view showing steps of a method for manufacturing a printed wiring board according to the third embodiment.
Figure 19:
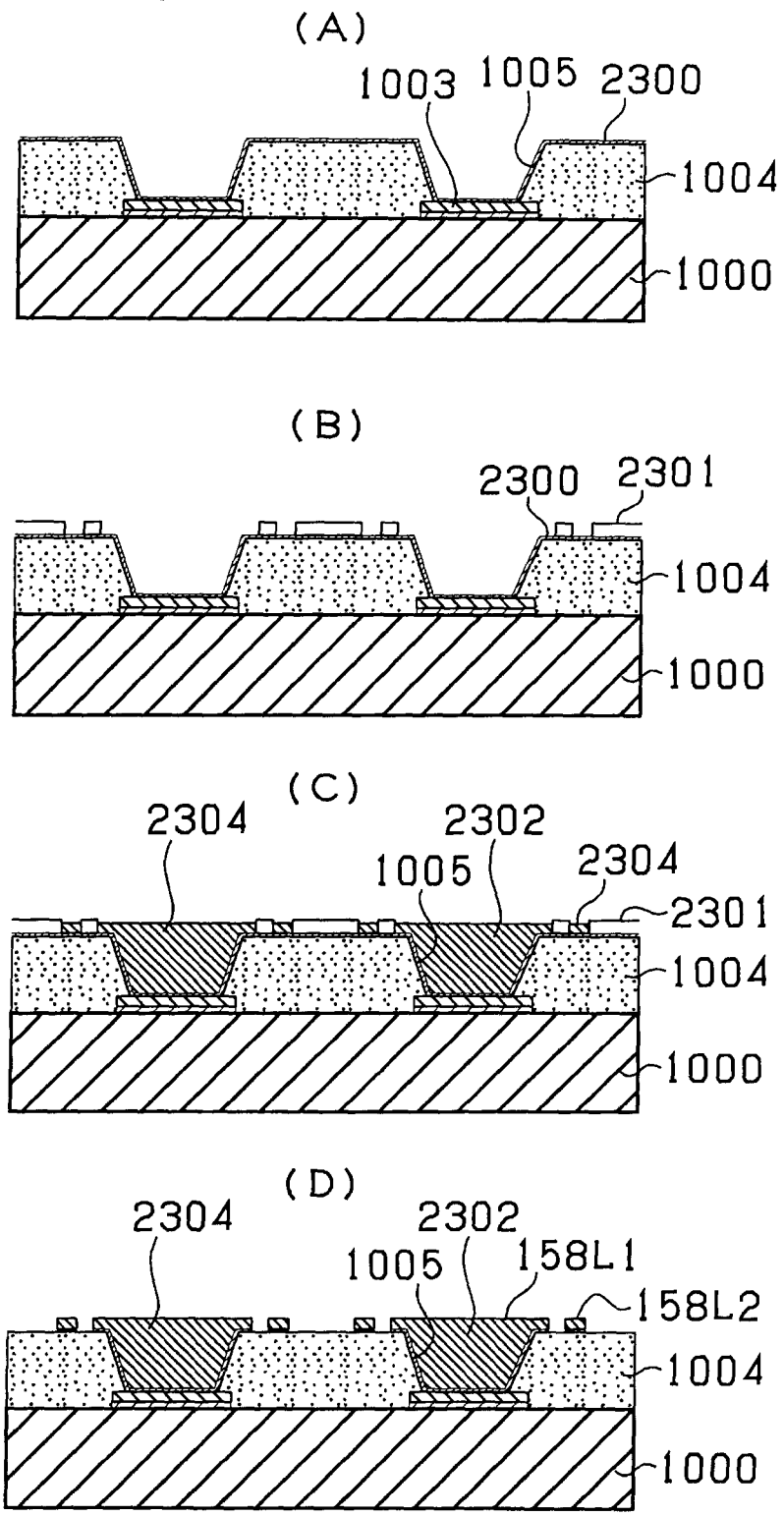
FIG. 19 is a view showing steps of a method for manufacturing a multilayer printed wiring board according to the third embodiment.
Figure 20:
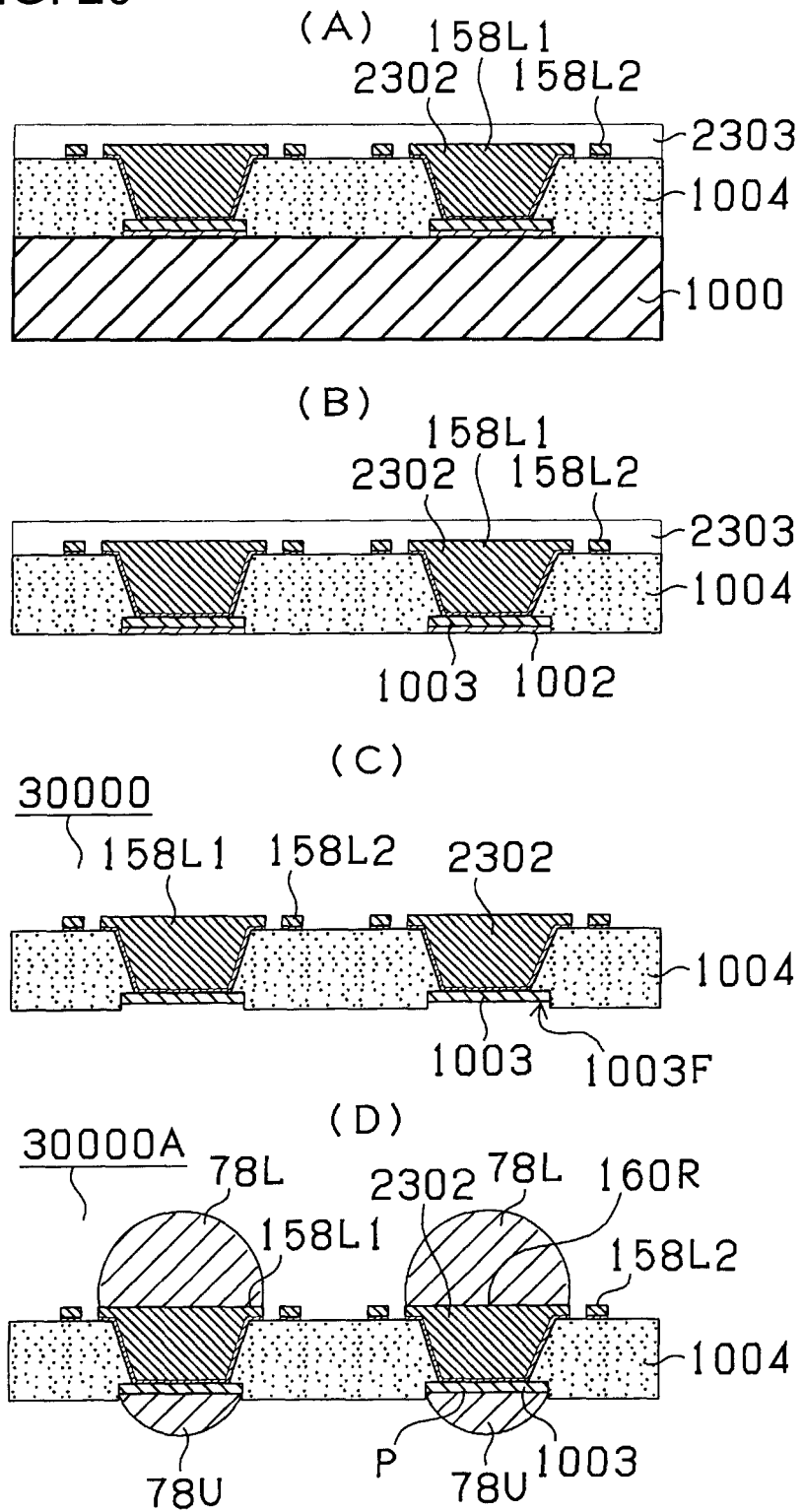
FIG. 20 is a view showing a multilayer printed wiring board and steps for its manufacturing method according to the third embodiment.

A method for manufacturing printed wiring board (30000A) shown in FIG. 20(D) is shown in FIGS. 18-20.

(1) Copper sheet 1000 is prepared as a starting material (FIG. 18(A)).

(2) Plating resist 1001 is formed on the copper sheet (FIG. 18(B)).

(3) By performing electroplating, nickel-plated film 1002 and copper-plated film 1003 are formed on the copper sheet exposed from the plating resist (FIG. 18C)).

(4) Plating resist 1001 is removed (FIG. 18D)).

(5) Interlayer resin insulation layer 1004 is formed on copper sheet 1000 and copper-plated film (FIG. 18E)). Interlayer resin insulation layer 1004 has a first surface and a second surface opposite the first surface. The first surface is the surface facing the copper sheet. The first surface is the surface exposed to the outside (see FIG. 20).

(6) Next, via-conductor opening 1005 which reaches copper-plated film 1003 is formed (FIG. 18(F)).

(7) Electroless plated film 2300 is formed on the second surface of interlayer resin insulation layer 1004, the inner wall of via-conductor opening 1005 and copper-plated film 1003 exposed through via-conductor opening 1005 (FIG. 19(A)).

(8) Plating resist 2301 for forming first and second lands is formed on electroless plated film 2300 (FIG. 19(B)). The pattern of plating resist 2301 for forming first and second lands is the same as in the first embodiment.

(9) Electrolytic plated film 2304 is formed on electroless plated film 2300 exposed from plating resist 2301. Simultaneously, via-conductor opening 1005 is filled with electrolytic plated film 2304 (FIG. 19(C)).

(10) Plating resist 2301 is removed. Next, electroless plated film exposed from electrolytic plated film 2304 is removed (FIG. 19(D)). First land (158L1) and second land (158L2) are formed on the second surface of interlayer resin insulation layer 1004. Via conductor 2302 is formed, connecting a first land and copper-plated film 1003. A solder pad is formed, being made up of first land (158L1) and via conductor 2302. The top surface of via conductor 2302 and the top surface of a second land are on substantially the same level. The catalyst attached to the second surface of the interlayer resin insulation layer may also be removed.

(11) Protective film 2303 is laminated on the second surface of interlayer resin insulation layer 1004, via conductor 2302, first land (158L1) and second land (158L2) (FIG. 20(A)).

(12) Copper sheet 1000 is removed by using an etching solution (FIG. 20(B)).

(13) Nickel-plated film 1002 is etched away and protective film 2303 is removed (FIG. 20(C)). The first surface of an electrode is exposed. The first surface of the electrode functions as a first solder pad. Coreless-type printed wiring board 30000 is completed as shown in FIG. 20(C).

(13) Then, using the same method as in the first embodiment, first solder bump (78U) is formed on first solder pad (P) and second solder bump (78L) is formed on second solder pad (160R) (FIG. 20(D)).

Printed wiring board 30000 has the following: interlayer resin insulation layer 1004 having a first surface and a second surface opposite the first surface; electrode (copper-plated film) 1003 embedded in interlayer resin insulation layer 1004 on the first-surface side of interlayer resin insulation layer 1004; first land (158L1) and second land (158L2) formed on the second surface of interlayer resin insulation layer 1004; and via conductor 2302 penetrating through interlayer resin insulation layer 1004 and connecting first land (158L1) and electrode 1003. Moreover, the first surface (1003F) of electrode 1003 left exposed by the first surface of interlayer resin insulation layer 1004 is recessed from the first surface of interlayer resin insulation layer 1004. Via conductor 2302 is formed on the second surface of electrode 1003, and the first surface and the second surface of the electrode are opposite each other.

First Modified Example of the Third Embodiment

Figure 21:
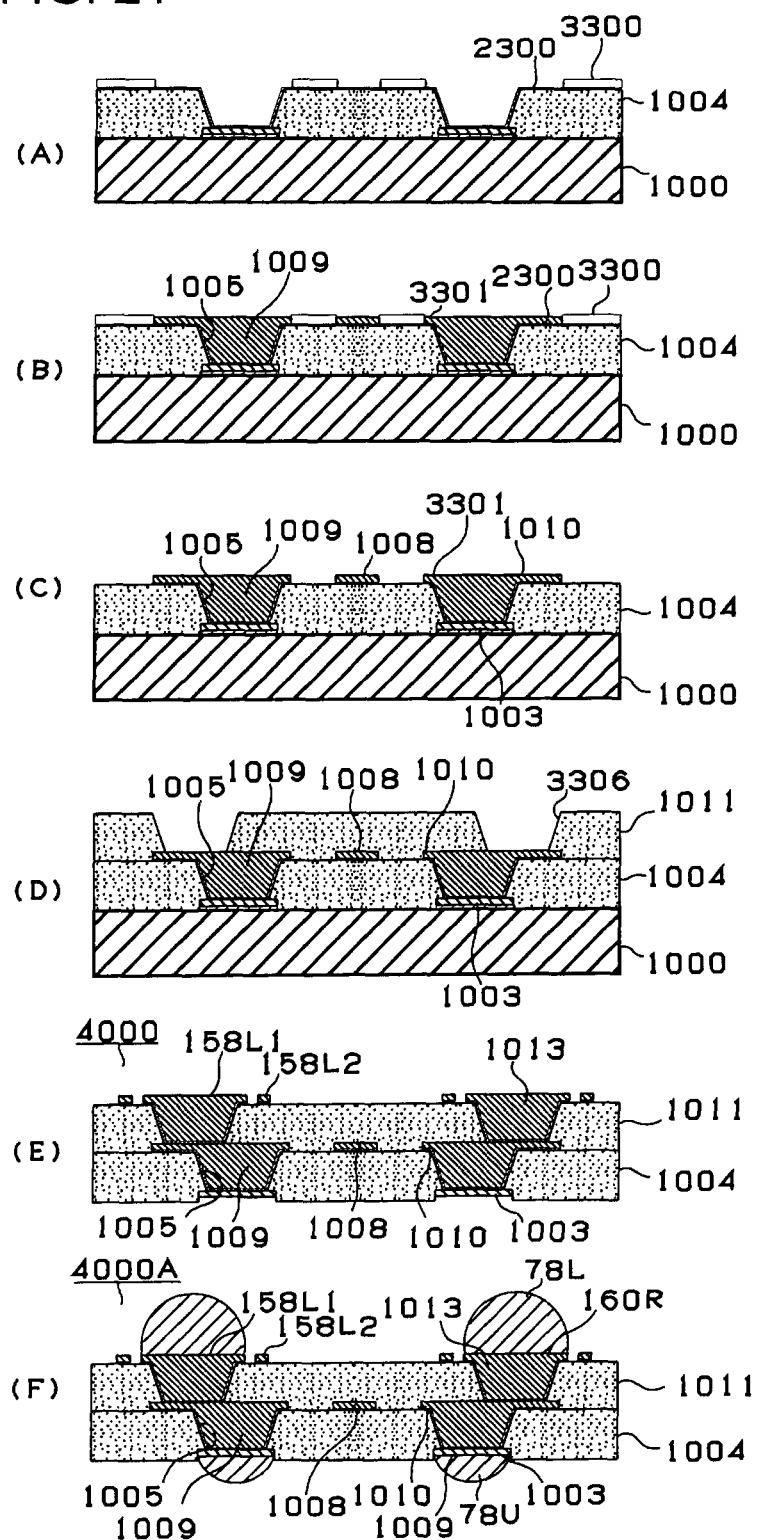
FIG. 21 is a view showing a multilayer printed wiring board and steps for its manufacturing method according to a first modified example of the third embodiment.

The printed wiring board according to the first modified example of the third embodiment is also a coreless-type printed wiring board. FIG. 21(E) shows printed wiring board 4000 according to the first modified example of the third embodiment. Printed wiring board 4000 is manufactured by the same method as in the third embodiment. Procedures (1) through (7) in the manufacturing method according to the first modified example of the third embodiment are the same as those of the manufacturing method according to the third embodiment.

Then, plating resist 3300 for forming via lands and conductive circuits are formed on electroless plated film 2300 (FIG. 21(A)). Electrolytic plated film 3301 is formed on electroless plated film 2300 exposed from plating resist 3300 (FIG. 21(B)). After the plating resist is removed, electroless plated film 2300 exposed from the electrolytic plated film is removed using an etching solution. Conductive circuit 1008 and via land 1010 are formed on the second surface of interlayer resin insulation layer 1004. Simultaneously, lower-layer via conductor 1009 is formed in via-conductor opening 1005. Lower-layer via conductor 1009 connects via land 1010 and copper-plated film 1003 (FIG. 21(C)).

Upper interlayer resin insulation layer 1011 is formed on the second surface of interlayer resin insulation layer 1004, via conductor 1009, conductive circuit 1008 and via land 1010. Upper interlayer resin insulation layer 1011 has a first surface and a second surface opposite the first surface. The first surface is the surface facing the second surface of interlayer resin insulation layer 1004. Next, upper-layer via-conductor opening 3306 reaching lower-layer via conductor 1009 is formed (FIG. 21(D)).

Next, the same procedures as in (7) through (12) in the third embodiment are performed on the upper interlayer resin insulation layer having upper-layer via-conductor openings. Coreless-type printed wiring board 4000 is completed (FIG. 21(E)).

(13) Using the same method as step (13) in the third embodiment, first solder bump (78U) is formed on a first solder pad (electrode 1003), and second solder bump (78L) is formed on second solder pad (160R) (FIG. 21(F)).

Printed wiring board 4000 according to the third embodiment is formed with the following: interlayer resin insulation layer 1004 having a first surface and a second surface opposite the first surface; electrode (copper-plated film) 1003 embedded in interlayer resin insulation layer 1004 on the first-surface side of interlayer resin insulation layer 1004; via land 1010 and conductive circuit 1008 formed on the second surface of interlayer resin insulation layer 1004; lower-layer via conductor 1009 penetrating through the interlayer resin insulation layer and connecting via land 1010 and electrode (copper-plated film) 1003; upper interlayer resin insulation layer 1011 formed on the second surface of interlayer resin insulation layer 1004, via conductor 1009, conductive circuit 1008 and via land 1010, and having a first surface and a second surface opposite the first surface; first land (158L1) and second via land (158L2) formed on the second surface of upper interlayer resin insulation layer 1011; and upper-layer via conductor 1013 penetrating through upper interlayer resin insulation layer 1011 and connecting first land (158L1) and lower-layer via conductor 1009. In addition, the first surface of electrode 1003 left exposed by the first surface of interlayer resin insulation layer 1004 is recessed from the first surface of interlayer resin insulation layer 1004. Lower-layer via conductor 1009 is formed on the second surface of electrode 1003, and the first surface of the electrode is opposite the second surface. The second surface of the interlayer resin insulation layer faces the first surface of the upper interlayer resin insulation layer. Interlayer resin insulation layer 1004 corresponds to an insulation layer, and upper interlayer resin insulation layer 1011 corresponds to an outermost interlayer resin insulation layer.

Since printed wiring boards according to the third embodiment and its modified example do not have thick insulative substrate 30, their strength is less than a printed wiring board according to the first embodiment. Printed wiring boards according to the third embodiment and its modified example are less tolerant to impact from being dropped. However, since printed wiring boards according to the third embodiment and its modified example have second lands, bonding strength is enhanced between solder bumps and second solder pads. Printed wiring boards according to the third embodiment and its modified example have second lands, while electrodes 1003 (first solder pads) are recessed from interlayer resin insulation layer 1004. Therefore, in printed wiring boards according to the third embodiment and its modified example, solder bumps are formed on electrodes and second solder pads without forming solder-resist layer 70 on each surface of a printed wiring board. The thickness of printed wiring boards according to the third embodiment and its modified example is set thinner. Since printed wiring boards according to the third embodiment and its modified example do not have solder-resist layers, they are tolerant to bending. Also, since such printed wiring boards are flexible, connection reliability increases between electronic components and printed wiring boards. Yield rates of mounted components become higher.

Interlayer resin insulation layers used for the third embodiment and its modified example are made of inorganic particles and resin, and are 30 μm~180 μm thick. Their thickness is less, compared to insulative substrate 30 in the first embodiment. To increase strength in printed wiring boards according to the third embodiment and its modified example, interlayer resin insulation layers used for the third embodiment may further contain a reinforcing material such as glass cloth. The same as in the first embodiment, second solder pads in printed wiring boards according to the third embodiment and its modified example are preferred to have recesses (160*i*).

Applied Examples of the Third Embodiment and its Modified Example

Applied Example (1)

Electronic components such as IC chips are loaded by means of first solder bumps onto printed wiring boards according to the third embodiment and its modified example. Printed wiring boards according to the third embodiment and its modified example are connected to motherboards by means of second solder bumps.

In the present applied example, diameter (V) of the via conductor that forms a second solder pad is 60~150 μm. The width of first land (158L1) is 10~40 μm, and the external diameter is 80~200 μm. Width (W) of space (S) is 70~130 μm. The width of second land (158L2) is 70~130 μm. The distance between adjacent second lands (158L2) is 70~130 μm. An electronic component having a narrower distance between electrodes may be loaded.

Applied Example (2)

Electronic components such as IC chips are loaded by means of second solder bumps onto printed wiring boards according to the third embodiment and its modified example. In printed wiring boards according to the third embodiment and its modified example, first solder pads and motherboards are connected by means of second solder bumps.

In the present applied example, the diameter of a fourth via conductor is 40~80 μm. The width of first land (158L1) is 10~20 μm, and the external diameter is 60~120 μm. Width (W) of space (S) is 12~20 μm. The width of second land (158L2) is 12~20 μm. The distance between adjacent second lands (158L2) is 12~20 μm. A second pad may have a tall solder bump on it. Therefore, since the distance is lengthened between electrodes of the electronic component and second solder pads, stress tends to be mitigated between the electronic component and the printed wiring board.

Fourth Embodiment

Figure 22:
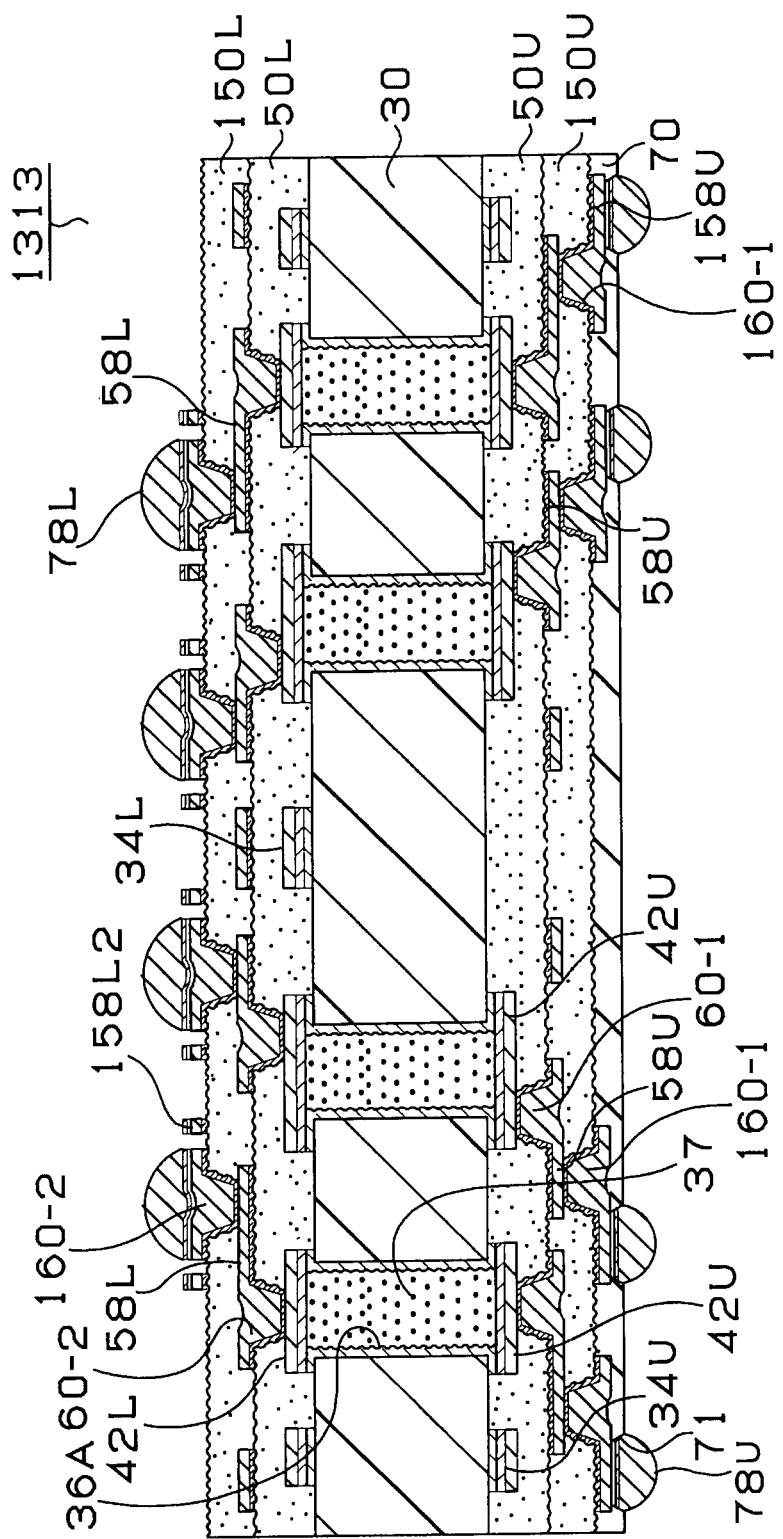
FIG. 22 is a cross-sectional view showing a multilayer printed wiring board according to the fourth embodiment.
Figure 23:
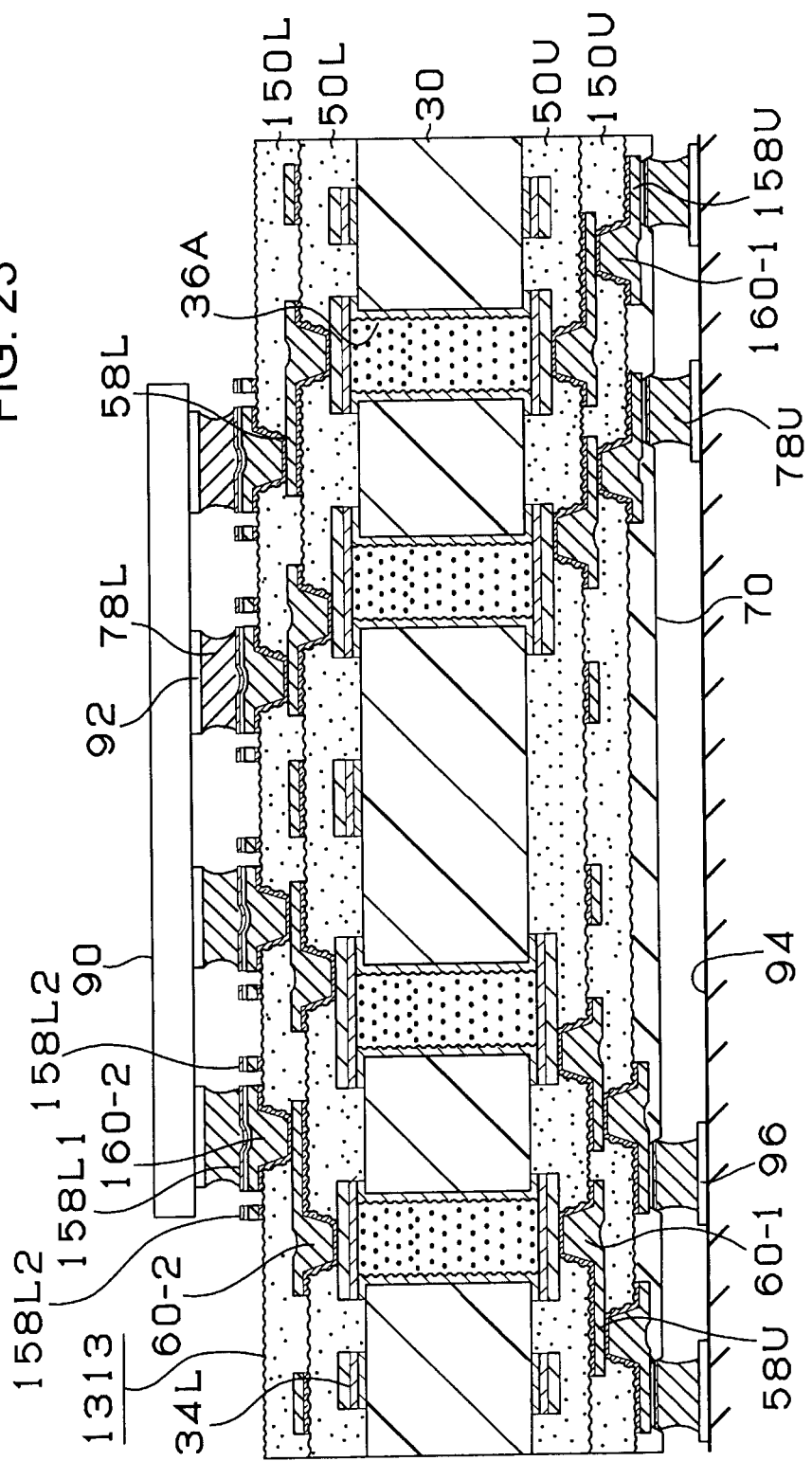
FIG. 23 is a cross-sectional view showing an IC chip mounted on the multilayer printed wiring board shown in FIG. 22.

A multi layer printed wiring board according to the fourth embodiment of the present invention is described with reference to FIG. 22. FIG. 22 shows a cross-sectional view of multilayer printed wiring board 1313 according to the fourth embodiment. FIG. 23 shows an applied example of the fourth embodiment. FIG. 23 shows a state in which IC chip 90 is mounted on multilayer printed wiring board 1313 shown in FIG. 22, and the printed wiring board is loaded on motherboard 94. Printed wiring board 1313 in the fourth embodiment is the same as a printed wiring board according to the first embodiment. However, solder bumps for connection with a motherboard and an electronic component in the fourth embodiment are different from those in the first embodiment. Except for those, a printed wiring board according to the fourth embodiment is the same as a printed wiring board according to the first embodiment. In the fourth embodiment, an electronic component such as an IC is mounted on second solder pads. Also, first solder pads of printed wiring board 1313 are connected with a motherboard by means of first solder pads (78U). There is no solder-resist layer formed on second upper interlayer resin insulation layer (150L). The second surface of second upper interlayer resin insulation layer (150L) is exposed from first land (158L1) and second land (158L2). On the other hand, solder resist 70 is formed on the second surface of first upper interlayer resin insulation layer (150U), the side to be connected to motherboard 94.

Figure 26:
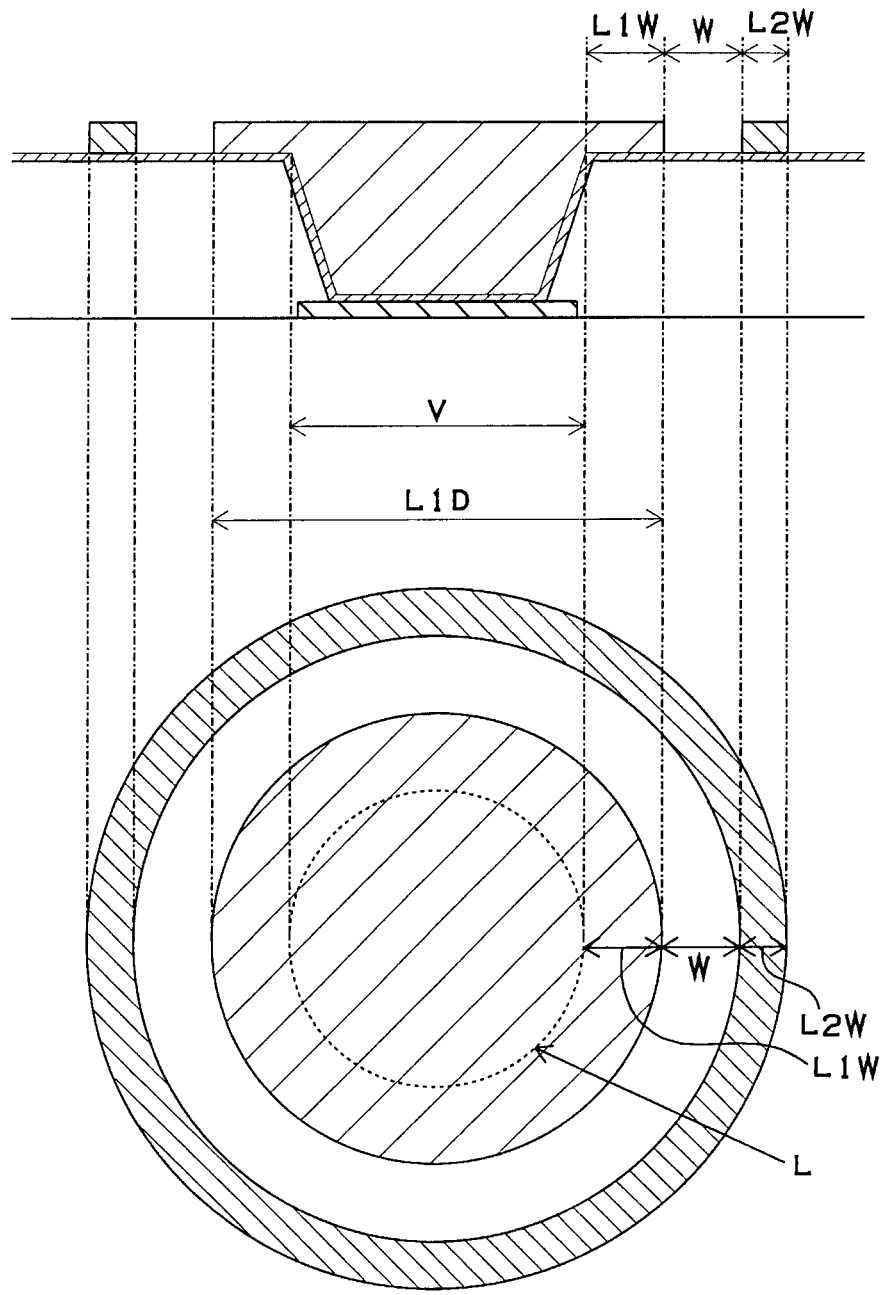
FIG. 26 is a magnified view showing a first land, a second land and a space.

Since an IC chip is mounted on second solder pads in the present embodiment, diameter (V) of fourth via conductor is 40~80 μm. Width (L1W) of first land (158L1) is 10~20 μm, and external diameter (L1D) is 60~120 μm. Width (W) of space (S) is 12~20 μm. Width (L2W) of second land (158L2) is 12~20 μm (see FIG. 26). The distance between adjacent second lands (158L2) is 12~20 μm.

Modified Example of the Fourth Embodiment

In a printed wiring board of the fourth embodiment, a first land and a second land are connected by short-circuit wiring (159a) or a second solder bump. In a printed wiring board of the present modified example, an IC chip are mounted on second solder pads. In a printed wiring board of the present modified example, a motherboard is connected with first solder pads.

Second upper interlayer resin insulation layer (150L) corresponds to an outermost interlayer resin insulation layer and second lower interlayer resin insulation layer (50L) corresponds to an insulation layer in the fourth embodiment and its modified example. The side of the second upper interlayer resin insulation layer is formed as a C4 surface in the fourth embodiment and its modified example. That is the side on which an electronic component such as IC chip 90 is flip-chip mounted. Since an IC chip is mounted using tall second solder bumps in the fourth embodiment and its modified example, stress is mitigated between an electronic component such as an IC chip and the printed wiring board.

Fifth Embodiment

Figure 24:
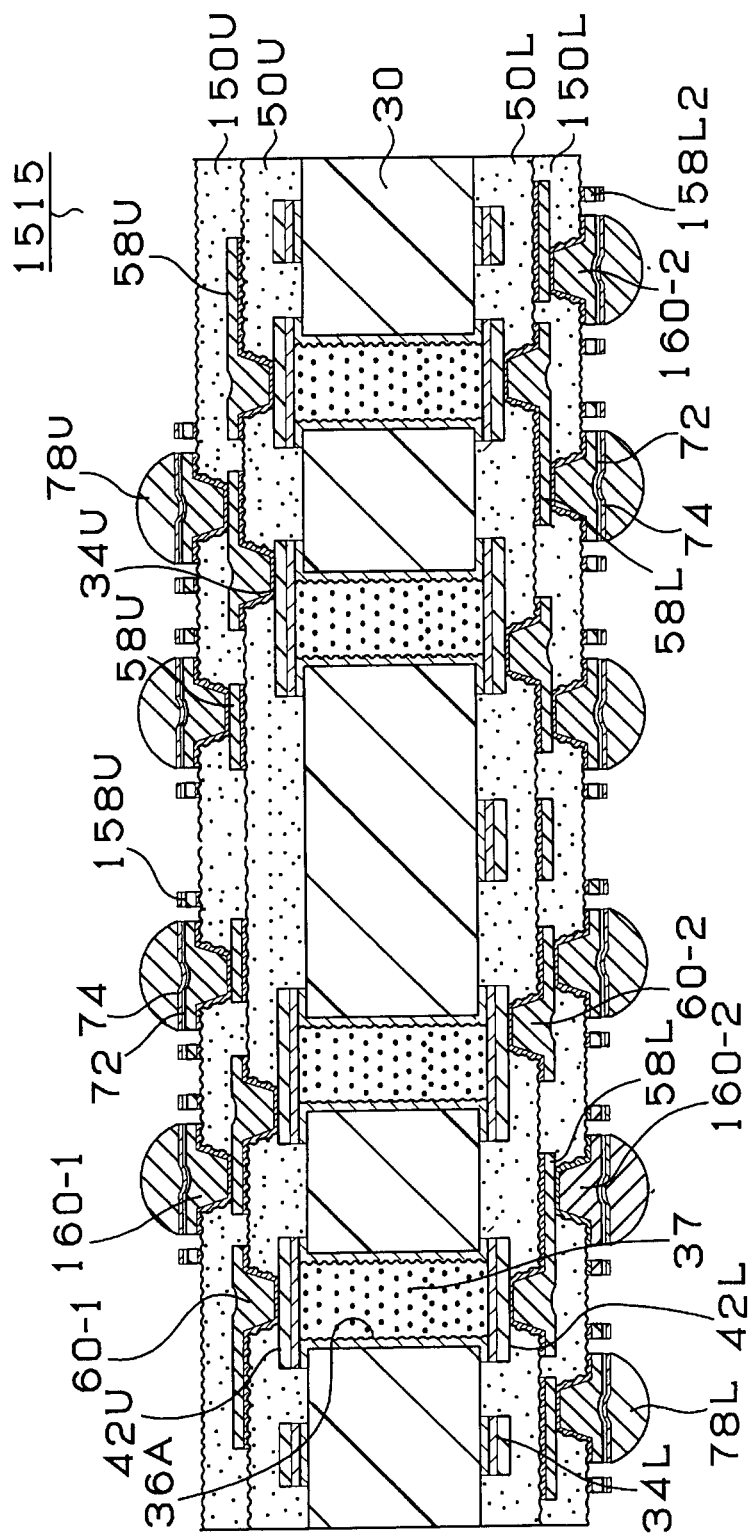
FIG. 24 is a cross-sectional view showing a multilayer printed wiring board according to the fifth embodiment.
Figure 25:
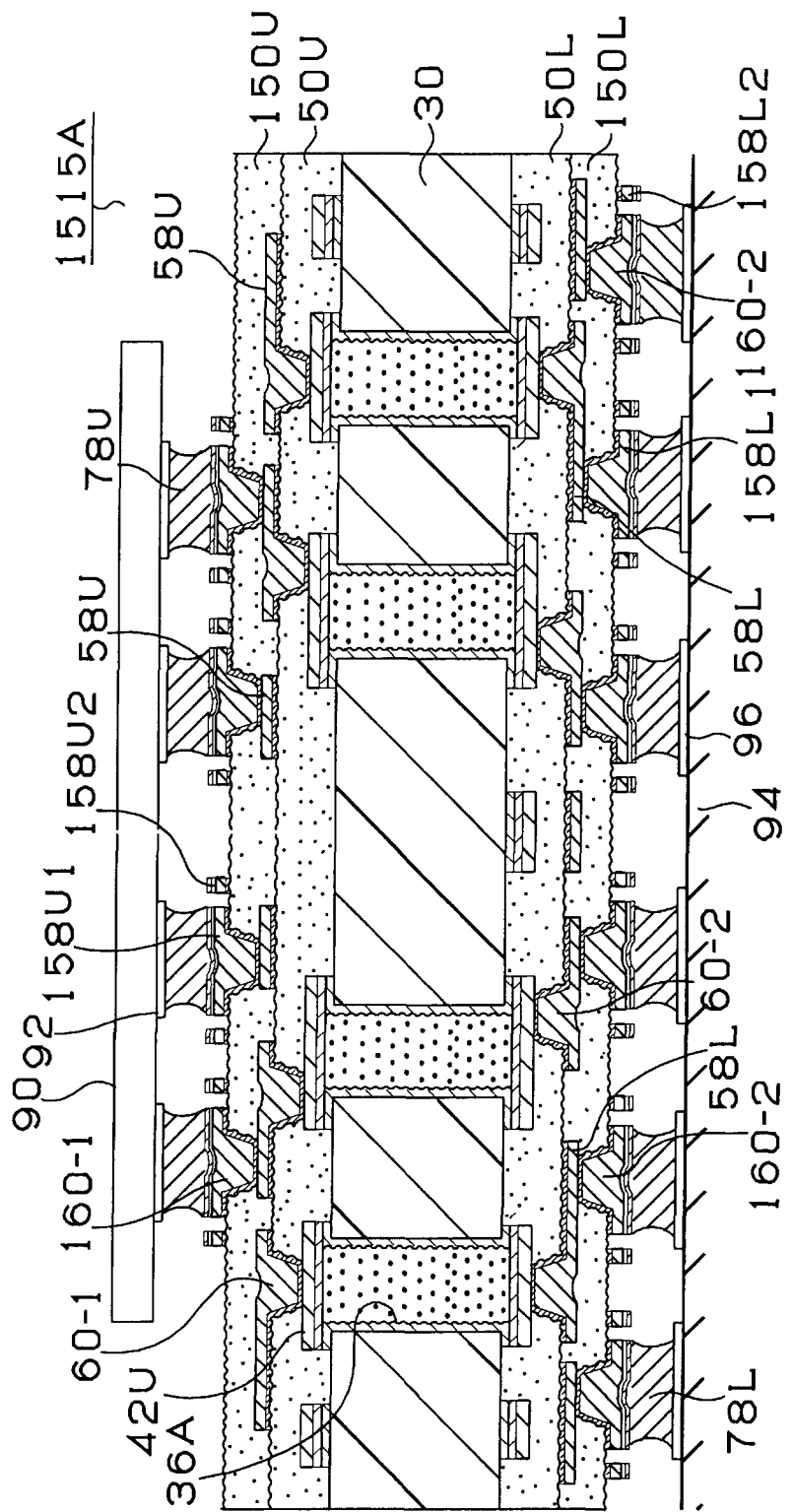
FIG. 25 is a cross-sectional view showing an IC chip mounted on the multilayer printed wiring board shown in FIG. 24.

Multilayer printed wiring board 1515 according to the fifth embodiment of the present invention is described with reference to FIGS. 24 and 25. FIG. 24 shows a cross-sectional view of multilayer printed wiring board 1515 according to the fifth embodiment. FIG. 25 shows an applied example of the fifth embodiment. FIG. 25 shows a state in which IC chip 90 is mounted on multilayer printed wiring board 1515 shown in FIG. 24 and the multilayer printed wiring board is loaded on motherboard 94. In a multilayer printed wiring board of the fifth embodiment, first land (158L1) and second land (158L2) are formed on the second surface of first upper interlayer resin insulation layer (150U) and on the second surface of second upper interlayer resin insulation layer (150L). Also, there is no solder-resist layer formed on the surface of either outermost interlayer resin insulation layer.

Modified Example of the Fifth Embodiment

In a printed wiring board according to the fifth embodiment, first land (158L1) and second land (158L2) are connected by short-circuit wiring (159a) or a second solder bump. First upper interlayer resin insulation layer (150U) and second upper interlayer resin insulation layer (150L) correspond to outermost interlayer resin insulation layers, and first lower interlayer resin insulation layer (50U) and second lower interlayer resin insulation layer (50L) correspond to insulation layers in the fifth embodiment and its modified example.

In the fifth embodiment, first lower interlayer resin insulation layer (50U) and second lower interlayer resin insulation layer (50L) may be omitted. In such a case, insulative substrate 30 corresponds to an insulation layer, and second upper interlayer resin insulation layer (150L) and first upper interlayer resin insulation layer (150U) correspond to outermost interlayer resin insulation layers. In the fifth embodiment and its modified example, solder bumps on both sides seldom fall from solder pads when an impact from being dropped is received.

Applied Example of the Fifth Embodiment

In a printed wiring board of the fifth embodiment and its modified example, an IC chip is mounted on second solder pads on the side of the first upper interlayer resin insulation layer. Also, printed wiring board 1515 and a motherboard is connected by means of second solder pads on the side of the second upper interlayer resin insulation layer.

In a printed wiring board according to the fifth embodiment and its modified example, diameter (V) of a third via conductor is 40~80 μm. Width (L1W) of first land (158L1) formed on the second surface of first upper interlayer resin insulation layer (150U) is 10~20 μm, and the external diameter is 60~120 μm. Width (W) of space (S) between a first land and a second land formed on the second surface of first upper interlayer resin insulation layer (150U) is 12~20 μm. The width of second land (158L2) formed on the second surface of first upper interlayer resin insulation layer (150U) is 12~20 μm. The distance between adjacent second lands (158L2) formed on the second surface of first upper interlayer resin insulation layer (150U) is 12~20 μm. Diameter (V) of a fourth via conductor is 60~150 μm. Width (L1W) of first land (158L1) formed on the second surface of second upper interlayer resin insulation layer (150L) is 10~40 μm, and external diameter (LID) is 80~200 μm. Width (W) of space (S) between a first land and a second land formed on the second surface of second upper interlayer resin insulation layer (150L) is 70~130 μm. The width of second land (158L2) formed on the second surface of second upper interlayer resin insulation layer (150L) is 70~130 μm. The distance between adjacent second lands (158L2) formed on the second surface of second upper interlayer resin insulation layer (150L) is 70~130 μm.

In a printed wiring board according to each embodiment, a first land and a second land are connected by short-circuit wiring (159a) or a second solder bump.

First Example

Forming a Core Substrate (1) Copper-clad laminate (30A) is a starting material (FIG. 1(A)). Insulative substrate 30 of copper-clad laminate (30A) is made of glass cloth and epoxy resin, and is 0.6 mm thick. In addition, 12 μm-thick copper foil 32 is laminated on both surfaces of insulative substrate 30. First, a penetrating hole for a through-hole conductor (through-hole-conductor penetrating hole) 33 is formed in copper-clad laminate (30A) by using a drill (FIG. 1(B)). Then, electroless plating and electrolytic plating are performed to form through-hole conductor (36b) on the side wall of penetrating hole 33 (FIG. 1(C)). Simultaneously, conductive film 36 made up of electroless plated film and electrolytic plated film is formed on the copper foils. As shown in FIG. 1(C), penetrating hole 34 is not filled with metal in the first example, and a printed wiring board according to the first example has penetrating hole (36A) inside a through-hole conductor. The surfaces of through-hole conductor (36b) and conductive film 36 are roughened (FIG. 1(D)).

(2) Next, resin filler 37 containing glass particles with an average particle diameter of 5 μm is filled in penetrating hole (36A) inside a through-hole conductor, dried and cured (FIG. 2(A)). Next, resin filler 37 bulging from penetrating hole (36A) inside a through-hole conductor is removed by polishing to level the surfaces of substrate 30 (not shown in the drawings). Penetrating hole (36A) inside a through-hole conductor is filled with resin filler 37 (FIG. 2(B)).

(3) Then, a palladium catalyst (made by Atotech) is attached to surfaces of substrate 30, and electroless copper plating is performed to form 1.2 μm-thick electroless copper-plated films 23 (FIG. 2(C)). Then, electrolytic copper plating is performed to form 15 μm-thick electrolytic copper-plated films 24. Plated film made up of electroless copper-plated film 23 and electrolytic copper-plated film 24 is formed on copper foils 32. At the same time, the plated film covers through-hole conductor (36b) and resin filler 37 (FIG. 2(D)).

(4) A commercially available dry film is laminated on both surfaces of substrate 3000 having plated films. Next, etching resists 25 are formed on the plated films by a photolithographic technique (FIG. 2(E)). Then, the plated film, conductive film 36 and copper foil 32 exposed from the etching resists are dissolved and removed using an etching solution and the etching resists are removed. Upper-surface conductive circuit (34U) and lower-surface conductive circuit (34L) are formed on insulative substrate 30. Simultaneously, upper-surface coating circuit (42U) and lower-surface coating circuit (42L) are formed to cover filler 37 (FIG. 3(A)). Core substrate 300 is completed, having insulative substrate 30, upper-surface conductive circuit (34U), lower-surface conductive circuit (34L), through-hole conductor (36b) and coating circuits 42. Then, by roughening surfaces of upper-surface conductive circuit (34U), lower-surface conductive circuit (34L), lower-surface coating circuit (42L) and upper-surface coating circuit (42U), roughened surfaces are formed (not shown in the drawings).

Forming Buildup Layers (1) Resin film for interlayer resin insulation layers (brand name: ABF-45SH, made by Ajinomoto) is laminated on both surfaces of core substrate 300. Then, by curing the resin film for interlayer resin insulation layers, lower interlayer resin insulation layers (50U, 50L) are formed on both surfaces of the core substrate (FIG. 2(B)). The lower interlayer resin insulation layer formed on the upper surface of the core substrate is first lower interlayer resin insulation layer (50U). First lower interlayer resin insulation layer (50U) has a first surface and a second surface opposite the first surface. The first surface of first lower interlayer resin insulation layer (50U) is the surface facing the core substrate.

The lower interlayer resin insulation layer formed on the lower surface of the core substrate is second lower interlayer resin insulation layer (50L). Second lower interlayer resin insulation layer (50L) has a first surface and a second surface opposite the first surface. The first surface of first lower interlayer resin insulation layer (50L) is the surface facing the core substrate.

(2) Next, using a $CO_2$ gas laser, via-conductor openings 51 with a diameter of 60 μm are formed in lower interlayer resin insulation layers 50 (FIG. 3(C)). First lower interlayer resin insulation layer (50U) has first opening (51U) which penetrates through first lower interlayer resin insulation layer (50U) and reaches upper-surface conductive circuit (34U) or upper-surface coating circuit (42U). Second lower interlayer resin insulation layer (50L) has second opening (51L) which penetrates through second lower interlayer resin insulation layer (50L) and reaches lower-surface conductive circuit (34L) or lower-surface coating circuit (42L). The substrate having via-conductor openings 51 is immersed for 10 minutes in an 80° C. solution containing 60 g/l permanganic acid to roughen surfaces of interlayer resin insulation layers (50U, 50L) including inner walls of via-conductor openings (51U, 51L) (FIG. 4(A)).

(3) Next, the substrate having via-conductor openings 51 is immersed in a neutralizer (made by Shipley Company) and washed with water. Furthermore, a catalyst is attached to surfaces of interlayer resin insulation layers 50 and inner walls of via-conductor openings 51 (not shown in the drawings).

(4) Next, the substrate is immersed in a commercially available electroless plating solution to form 0.3~3.0 μm-thick electroless copper-plated film 52 on surfaces of interlayer resin insulation layers and on inner walls of via-conductor openings (FIG. 4(B)).

(5) Then, plating resists 54 with predetermined patterns are formed on electroless copper-plated films 52.

(6) Then, the substrate is immersed in a commercially available electrolytic copper plating solution (such as a plating solution made by C. Uyemura & Co., Ltd.). Using the electroless copper-plated film as a seed layer, electrolytic copper-plated film 56 is formed on the electroless copper-plated film exposed from the plating resists (FIG. 4(C)). Via-conductor openings are filled with electrolytic copper-plated film 56. The thickness of the electrolytic plated film is 12 μm.

(7) The plating resists are removed and electroless copper-plated film 52 between portions of electrolytic copper-plated film is etched away. First lower conductive circuit (58U) is formed on the second surface of the first lower interlayer resin insulation layer. First via conductor (60-1) filled in via-conductor opening (51U) is formed in the first lower interlayer resin insulation layer. First via conductor (60-1) connects upper-surface conductive circuit (34U) or upper-surface coating circuit (42U) and first lower conductive circuit (58U).

Second lower conductive circuit (58L) is formed on the second surface of the second lower interlayer resin insulation layer. Second via conductor (60-2) filled in second opening (51L) is formed in the second lower interlayer resin insulation layer. Second via conductor (60-2) connects lower-surface conductive circuit (34L) or lower-surface coating circuit (42L) and second lower conductive circuit (58L). Next, surfaces of a first lower conductive circuit, second lower conductive circuit, first via conductor and second via conductor are roughened (not shown in the drawings).

(8) Then, resin film for interlayer resin insulation layers (brand name: ABF-45SH, made by Ajinomoto) is laminated on the first lower interlayer resin insulation layer, first lower conductive circuit and first via conductor. Resin film for interlayer resin insulation layers (brand name: ABF-45SH, made by Ajinomoto) is laminated on the second lower interlayer resin insulation layer, second lower conductive circuit and second via conductor. After that, by curing resin films for interlayer resin insulation layers, upper interlayer resin insulation layers (150U, 150L) are formed on lower interlayer resin insulation layers (50U, 50L) (FIG. 5(A)).

The upper interlayer resin insulation layer formed on first lower interlayer resin insulation layer (50U) is first upper interlayer resin insulation layer (150U). First upper interlayer resin insulation layer (150U) has a first surface and a second surface opposite the first surface. The first surface of first upper interlayer resin insulation layer (150U) is the surface facing the second surface of first lower interlayer resin insulation layer (50U). The upper interlayer resin insulation layer formed on second lower interlayer resin insulation layer (50L) is second upper interlayer resin insulation layer (150L). Second upper interlayer resin insulation layer (150L) has a first surface and a second surface opposite the first surface. The first surface of second upper interlayer resin insulation layer (150L) is the surface facing the second surface of second lower interlayer resin insulation layer (50L).

(9) Next, using a $CO_2$ laser, via-conductor openings (151U, 151L) are formed in upper interlayer resin insulation layers (150U, 150L) (FIG. 5(B)). First upper interlayer resin insulation layer (150U) has third opening (151U) which penetrates through first upper interlayer resin insulation layer (150U) and reaches first lower conductive circuit (58U) or first via conductor (60-1). The diameter of via-conductor opening (151U) is 60 μm. Second upper interlayer resin insulation layer (150L) has fourth opening (151L) which penetrates through second upper interlayer resin insulation layer (150L) and reaches second lower conductive circuit (58L) or second via conductor (60-2). The diameter of via-conductor opening (151L) is 120 µm.

(10) Surfaces of upper interlayer resin insulation layers (150U, 150L) are roughened the same as surfaces of lower interlayer resin insulation layers (FIG. 5(B)).

(11) Then, the substrate having via-conductor openings 151 is immersed in a neutralizer (made by Shipley Company) and washed with water. Moreover, a catalyst is attached to surfaces of upper interlayer resin insulation layers (150U, 150L) and inner walls of via-conductor openings (151U, 151L).

(12) Next, the substrate is immersed in a commercially available electroless plating solution to form electroless copper-plated films (152U, 152L) with a thickness of 0.3~3.0 µm on surfaces of interlayer resin insulation layers and inner walls of via-conductor openings (FIG. 5(C)).

(13) As shown in FIG. 10, plating resist (54U) with a predetermined pattern for forming first and second lands is formed on electroless copper-plated film (152U) of first upper interlayer resin insulation layer (150U). Also, plating resist (54L) with a predetermined pattern for forming first and second lands is formed on electroless copper-plated film (152L) of second upper interlayer resin insulation layer (150L). The (m) on the second surface of first upper interlayer resin insulation layer (150U) is 22 µm, (W1) is 12 µm, and (N) is 20 µm. The (m) on the second surface of second upper interlayer resin insulation layer (150L) is 22 µm, (W1) is 105 µm, and (N) is 105 µm.

(14) Next, the substrate is immersed in a commercially available electrolytic copper plating solution (made by C. Uyemura & Co., Ltd.). Using the electroless copper-plated film as a seed layer, electrolytic copper-plated film 156 is formed on the electroless copper-plated film exposed from the plating resists. Via-conductor openings 151 are filled with electrolytic plated film 156. The thickness of the electrolytic plated film on the upper interlayer resin insulation layers is 12 µm.

(15) Plating resists are removed, and electroless copper-plated films (152U, 152L) between portions of electrolytic copper-plated film 156 are etched away. First land (158L1) and second land (158L2) are formed on the second surface of first upper interlayer resin insulation layer (150U) and on the second surface of the second upper interlayer resin insulation layer (see FIG. 24). A second-1 solder pad made up of third via conductor (160-1) and a first land is formed. A second-2 solder pad made up of fourth via conductor (160-2) and a first land is formed. The substrate having first and second lands is immersed in a solution containing 60 g/l permanganic acid. The temperature of the solution is 60° C. and the immersion time is one minute. The catalyst attached to the second surfaces of upper interlayer resin insulation layers is removed.

Width (L1W) of first land (158L1) on the second surface of first upper interlayer resin insulation layer (150U) is 20 µm, width (G) of space (S) is 16 µm, and the width of a second land is 16 µm. The distance between adjacent second lands is 16 µm.

Width (L1W) of first land (158L1) on the second surface of second upper interlayer resin insulation layer (150L) is 20 µm, width (G) of space (S) is 100 µm, and the width of a second land is 100 µm. The distance between adjacent second lands is 100 µm. Top surfaces of third via conductor (160-1) and fourth via conductor (160-2) are recessed. The depth of recess (160i) is 5 µm.

(16) Next, the substrate is immersed in an electroless nickel plating solution to form 5 µm-thick nickel-plated layer 72 on the surfaces (top and side surfaces) of second-1 solder pads, on the surfaces (top and side surfaces) of second-2 solder pads and on the surfaces (top and side surfaces) of second lands. Moreover, the substrate is immersed in an electroless gold plating solution to form 0.03 µm-thick gold-plated layer 74 on nickel-plated layer 72 (FIG. 24).

(17) Mask 80 having openings (80a) corresponding to second-2 solder pads is prepared. The diameter of openings (80a) is 120 µm, and the diameter of second-2 solder pads is 160 µm. A second-2 solder pad and opening (80a) are aligned, and mask 80 is placed on the second upper resin insulation layer (FIG. 7(A)). Flux 82 is applied on the second pad through opening (80a) of mask 80. Next, mask 80 is removed from the second upper resin insulation layer (FIG. 7(B)). A mask for loading solder balls is prepared. The mask for loading solder balls has openings in positions corresponding to second-2 solder pads. A second solder pad and opening (84a) of the mask for loading solder balls are aligned, and mask 84 for loading solder balls is fixed onto the second upper resin insulation layer (FIG. 7(C)). Then, using a method for loading solder balls described in U.S. 2006-0157540 (A1), a solder ball made of Sn/Ag is loaded on a second-2 solder pad. The mask for loading solder balls is removed from the substrate. Second solder bump (78L) is formed on the second-2 solder pad through a reflow process.

(18) Next, mask 80 is aligned in a position facing second-1 solder pads. Then, the mask is fixed onto the first surface of the first upper interlayer resin insulation layer. The opening diameter of mask 80 is 60 µm, and the diameter of second-1 solder pads is 100 µm. Flux is applied on second-1 solder pads through openings (80a) of mask 80. Then, mask 80 is removed from the first upper resin insulation layer. A mask for loading solder balls is prepared. The mask for loading solder balls has openings in positions corresponding to second-1 solder pads. A second-1 solder pad and an opening in the mask for loading solder balls are aligned, and the mask for loading solder balls is placed on the first upper resin insulation layer. Then, using a method for loading solder balls described in U.S. 2006/0157540 (A1), a solder ball made of Sn/Pb is loaded on the second-1 solder pad. The mask for loading solder balls is removed from the substrate. A first solder bump is formed on the second-1 solder pad through a reflow process. Printed wiring board 1515 is completed as shown in FIG. 24.

Second Example

Forming a Core Substrate

The method for forming a core substrate is the same as that in the first example.

Forming Buildup Layers

The method for forming buildup layers is similar to that in the first example. A printed wiring board in the second example is manufactured the same as in the first example until electroless copper-plated film is formed on upper interlayer resin insulation layers. A plating resist with a predetermined pattern for forming first and second lands is formed on the electroless copper-plated film formed on the second upper interlayer resin insulation layer (see FIG. 10). The (m) on the second surface of second upper interlayer resin insulation layer (150L) is 22 µm, (W1) is 105 µm and (N) is 105 µm.

A plating resist with a predetermined pattern for forming via lands, conductive circuits and pads is formed on the electroless copper-plated film formed on the first upper interlayer resin insulation layer (see FIG. 11). The (X) on the second surface of first upper interlayer resin insulation layer (150U) is 22 µm. Next, the substrate is immersed in a commercially available electrolytic copper plating solution (made by C.

Uyemura & Co., Ltd.). Using the electroless copper-plated film as a seed layer, electrolytic copper-plated film 156 is formed on the electroless copper-plated film exposed from the plating resists (FIG. 6(A)). Via-conductor openings are filled with electrolytic plated film 156. The thickness of the electrolytic plated film on the upper interlayer resin insulation layers is 12 µm.

The plating resists are removed and electroless copper-plated film 152 between portions of electrolytic copper-plated film 156 is etched away. Via lands, conductive circuits and pads are formed on the first upper interlayer resin insulation layer. The width of a via land is 20 µm, and the external diameter is 100 µm. First land (158L1) and second land (158L2) are formed on the second upper interlayer resin insulation layer. A second solder pad made up of a fourth via conductor and a first land is formed. Width (L1W) of first land (158L1) is 20 µm. External diameter (L1D) of a first land is 180 µm. Width (G) of space (S) is 100 µm. The width of a second land is 100 µm. The top surface of a fourth via conductor is recessed. The depth of recess (160i) is 2 µm.

Next, solder-resist layer 70 is formed, covering the second surface of the first upper interlayer resin insulation layer, third via conductors, via lands, conductive circuits and pads. By using a laser, openings are formed in the solder-resist layer to expose top surfaces of a via conductor and a pad. The top surfaces of a third via conductor and a pad exposed from the solder-resist layer become first solder pads. Wet blasting is performed on the second surface of the second upper interlayer resin insulation layer. The catalyst is removed from the second surface of the second upper interlayer resin insulation layer. A metal layer made of Ni/Pd/Au is formed on the surfaces of a first solder pad, second solder pad and second land.

A second solder bump is formed on a second solder pad using the method described in step (17) of the first example. A first solder bump made of Sn/Pb is formed on a first solder pad by printing solder paste made of Sn/Pb on a first solder pad and by reflowing the paste. Printed wiring board 10 shown in FIG. 8 is completed.

Third Example (1) Copper sheet 1000 with a thickness of 0.3 mm is prepared (FIG. 18(A)).

(2) Plating resist 1001 with a predetermined pattern for forming electrodes is formed on the copper sheet (FIG. 18(B)).

(3) Using the copper sheet as a seed layer, nickel-plated film 1002 is formed on the copper sheet exposed from the plating resist. Next, copper-plated film 1003 is formed on the nickel-plated film (FIG. 18(C)). The thickness of the nickel film is 5 µm, and the thickness of the copper-plated film is 15 µm.

(4) Plating resist 1001 is removed (FIG. 18(D)).

(5) Interlayer resin insulation layer 1004 (brand name: ABF-45SH, made by Ajinomoto) having a first surface and a second surface opposite the first surface is formed on the copper sheet and the copper-plated film. The first surface is the surface facing the copper sheet (FIG. 18(E)).

(6) Opening 1005 reaching the copper-plated film is formed in interlayer resin insulation layer 1004 (FIG. 18(F)). The opening diameter (the diameter on the second surface of the interlayer resin insulation layer) is 50 µm.

(7) The surface of interlayer resin insulation layer 1004 (including the inner wall of opening 1005) and an electrode exposed through opening 1005 are immersed in an electroless copper plating solution (Thru-Cup made by C. Uyemura & Co., Ltd.). On the surface of interlayer resin insulation layer 1004 (including the inner wall of opening 1005) and an electrode exposed through opening 1005, 1.2 µm-thick electroless copper-plated film 2300 is formed (FIG. 19(A)).

(8) Plating resist 2301 for forming first and second lands is formed on electroless copper-plated film 2300 (FIG. 19(B)).

(9) Electroless copper-plated film exposed from plating resist 2301 is immersed in a copper sulfate solution. Using electroless copper-plated film 2300 as a seed layer, electrolytic copper-plated film 2304 is formed on the electroless copper-plated film exposed from plating resist 2301 (FIG. 19(C)). Simultaneously, opening 1005 is filled with electrolytic copper-plated film, forming via conductor 2302. The thickness of electrolytic copper-plated film 2302 on interlayer resin insulation layer 1004 is 12 µm.

(11) Plating resist 1001 is removed. By removing electroless copper-plated film between portions of electrolytic copper-plated film using an etching solution, first land (158L1) and second land (158L2) are formed on the second surface of interlayer resin insulation layer 1004 (FIG. 19(D)). The external diameter of a first land is 80 µm, the internal diameter of a second land is 110 µm, and the external diameter of a second land is 140 µm. Width (W) of space (S) is 15 µm. The top surface of a second land and the top surface of via conductor 2302 are positioned on substantially the same level. A second solder pad is obtained, being made up of first land (158L1) and via conductor 2302. The catalyst is removed by immersing the substrate in a permanganic acid solution.

(12) The second surface of the interlayer resin insulation layer, a second solder pad and a second land are covered with PET film 2303 (FIG. 20(A)).

(13) Copper sheet 1000 is selectively etched using an etching solution (copper selective etchant CS series, made by Nihon Kagaku Sangyo Co., Ltd.) (FIG. 20(B)).

(14) Nickel-plated film 1002 is selectively etched using an etching solution (nickel selective etchant NC, made by Nihon Kagaku Sangyo Co., Ltd.). By removing PET film 2303, printed wiring board 30000 shown in FIG. 20(C) is completed.

(15) Solder bumps are formed on second solder pads and electrodes using the method described in U.S. 2006/0157540 (A1). A solder bump formed on second solder pad (160R) is second solder bump (78L), and a solder bump formed on electrode 1003 is first solder bump (78U).

Fourth Example

A printed wiring board in the fourth example is similar to that in the third example. Procedures (1) through (7) are the same as those in the third example. Then, plating resist 3300 for forming via lands and conductive circuits is formed on electroless copper-plated film 2300 (FIG. 21(A)).

Using electroless plated film 2300 as a seed layer, electrolytic copper-plated film 3301 is formed on the electroless copper-plated film exposed from plating resist 3300 (FIG. 21(B)). Simultaneously, opening 1005 is filled with electrolytic copper-plated film, forming lower-layer via conductor 1009. The thickness of electrolytic copper-plated film 3301 on lower interlayer resin insulation layer 1004 is 12 µm. Plating resist 3300 is removed. Electroless copper-plated film exposed from electrolytic copper-plated film 3301 is removed (FIG. 21(C)). Via land 3301 and lower conductive circuit 1008 are formed on the second surface of lower interlayer resin insulation layer 1004.

Upper interlayer resin insulation layer 1011 is formed on the second surface of lower interlayer resin insulation layer 1004, lower-layer via conductor 1009, via land 3301 and lower conductive circuit 1008. Upper interlayer resin insulation layer 1101 has a first surface and a second surface opposite the first surface. The first surface of upper interlayer resin insulation layer 1101 faces the second surface of lower interlayer resin insulation layer 1004. Upper-layer opening 3336, which penetrates through the upper interlayer resin insulation layer and reaches lower-layer via conductor 1109, is formed in the upper interlayer resin insulation layer (FIG. 21(D)).

After the above, procedures (7) through (14) in the third example are performed, and printed wiring board 4000 shown in FIG. 21(E) is completed.

Applied Example 3

On printed wiring boards obtained in the first example, second example, third example and fourth example, electronic components such as IC chips are mounted by means of first solder bumps, and such printed wiring boards are loaded on motherboards by means of second solder bumps.

Applied Example 4

On printed wiring boards obtained in the first example, second example, third example and fourth Example, electronic components such as IC chips are mounted by means of second solder bumps, and such printed wiring boards are loaded on motherboards by means of first solder bumps.

A printed wiring board could occasionally receive an impact caused when a device containing the printed wiring board is dropped or the like. At those times, vibrations are transmitted to surfaces of the printed wiring board. A printed wiring board of the present embodiment has an annular second land around a second solder pad. Thus, the second land prevents transmission of the vibrations and decrease the amplitude of the vibrations to be transmitted to the inner solder pad (second solder pad). Accordingly, chances of a solder bump falling off the solder pad due to the impact of being dropped or the like decrease and connection reliability increases.

Obviously, numerous modifications and variations of the present invention are possible in light of the above teachings. It is therefore to be understood that within the scope of the appended claims, the invention may be practiced otherwise than as specifically described herein.

What is claimed is:

1. A printed wiring board, comprising:
an insulation layer;
a conductive circuit on the insulation layer;
an outermost interlayer resin insulation layer formed on the insulation layer and the conductive circuit and having a via-conductor opening connected to the conductive circuit;
a land structure comprising a first land formed on the outermost interlayer resin insulation layer around the via-conductor opening and a second land formed on the outermost interlayer resin insulation layer surrounding the first land; and
a via conductor formed in the via-conductor opening through the outermost interlayer resin insulation layer such that the first land of the land structure on the outermost interlayer resin insulation layer is connected to the conductive circuit on the insulation layer,
wherein the land structure has a space between the first land and second land of the land structure, the first land of the land structure is directly connected to the via conductor, the first land of the land structure comprises a first portion of a plated film, the second land of the land structure comprises a second portion of the plated film, and the via conductor comprises a third portion of the plated film filling the via-conductor opening through the outermost interlayer resin insulation layer.

2. The printed wiring board according to claim 1, further comprising a solder bump formed on the via conductor and the first land of the land structure, wherein the via conductor and the first land of the land structure form a solder pad upon which the solder bump is formed.

3. The printed wiring board according to claim 2, wherein the solder bump is formed on the second land of the land structure and the solder pad.

4. The printed wiring board according to claim 1, wherein the space between the first land and second land of the land structure is exposing a surface of the outermost interlayer resin insulation layer.

5. The printed wiring board according to claim 4, wherein the insulation layer comprises a resin and a reinforcing material.

6. The printed wiring board according to claim 5, further comprising:
a second conductive circuit formed on the insulation layer on an opposite side of the conductive circuit;
an interlayer resin insulation layer formed on the insulation layer and the second conductive circuit and having a via conductor opening connected to the second conductive circuit through the interlayer resin insulation layer;
a via land formed on the interlayer resin insulation layer;
a third via conductor formed in the via-conductor opening in the interlayer resin insulation layer such that the via land is connected to the second conductive circuit;
a solder-resist layer formed on the interlayer resin insulation layer, the third via conductor and the via land; and
a solder bump formed on the third via conductor exposed through an opening in the solder-resist layer.

7. The printed wiring board according to claim 6, wherein the via conductor and the first land of the land structure form a solder pad is a configured to connect a motherboard, and the solder bump on the third via conductor is a bump configured to load an electronic component.

8. The printed wiring board according to claim 1, wherein the second land of the land structure is formed on the outermost interlayer resin insulation layer independent from the first land of the land structure.

9. The printed wiring board according to claim 1, wherein the first land and second land of the land structure are directly connected by a wiring formed on the outermost interlayer resin insulation layer.

10. The printed wiring board according to claim 1, wherein the via conductor and the first land of the land structure form a solder pad configured to load an electronic component.

11. The printed wiring board according to claim 1, wherein the via conductor and the first land of the land structure form a solder pad configured to connect a motherboard.

12. The printed wiring board according to claim 1, wherein the via conductor and the first land of the land structure form a solder pad, and the via conductor has a top surface which is recessed from a top surface of the first land.

13. The printed wiring board according to claim 1, wherein the second land of the land structure is formed on the outermost interlayer resin insulation layer independent from the first land of the land structure, and the via conductor and the first land of the land structure form a solder pad.

14. The printed wiring board according to claim 1, wherein the second land of the land structure has an annular shape surrounding the first land and is formed on the outermost interlayer resin insulation layer independent from the first land of the land structure.

15. The printed wiring board according to claim 1, wherein the first land and second land of the land structure are directly connected by a wiring formed on the outermost interlayer resin insulation layer, and the via conductor and the first land of the land structure form a solder pad.

16. A printed wiring board, comprising:
   an interlayer resin insulation layer;
   an electrode embedded in the interlayer resin insulation layer;
   a land structure comprising a first land formed on the interlayer resin insulation layer on an opposite side of the electrode and a second land formed on the interlayer resin insulation layer surrounding the first land; and
   a via conductor penetrating through the interlayer resin insulation layer and connecting the first land of the land structure and the electrode,
   wherein the land structure has a space between the first land and second land of the land structure, the electrode has a surface left exposed by the interlayer resin insulation layer and recessed from a surface of the interlayer resin insulation layer, the first land of the land structure comprises a first portion of a plated film, the second land of the land structure comprises a second portion of the plated film, and the via conductor comprises a third portion of the plated film filling the via-conductor opening through the outermost interlayer resin insulation layer.

17. The printed wiring board according to claim 16, further comprising a solder bump formed on a solder pad, wherein the via conductor and the first land of the land structure form the solder pad.

18. The printed wiring board according to claim 16, further comprising a solder bump formed on a solder pad, wherein the via conductor and the first land of the land structure form the solder pad, and the solder bump is formed on the second land of the land structure and the solder pad.

19. The printed wiring board according to claim 16, wherein the second land of the land structure is formed on the outermost interlayer resin insulation layer independent from the first land of the land structure, and the via conductor and the first land of the land structure form a solder pad.

20. The printed wiring board according to claim 16, wherein the first land and second land of the land structure are directly connected by a wiring formed on the outermost interlayer resin insulation layer, and the via conductor and the first land of the land structure form a solder pad.

* * * * *